(12) United States Patent
Warren

(10) Patent No.: US 12,501,197 B2
(45) Date of Patent: Dec. 16, 2025

(54) HEADPHONE APPARATUS AND METHODS FOR CONFIGURATION-BASED POWER SWITCHING

(71) Applicant: Auto Ears LLC, Seattle, WA (US)

(72) Inventor: Logan Andrew Warren, Seattle, WA (US)

(73) Assignee: Auto Ears LLC, Seattle, WA (US)

( * ) Notice: Subject to any disclaimer, the term of this patent is extended or adjusted under 35 U.S.C. 154(b) by 104 days.

(21) Appl. No.: 17/935,112

(22) Filed: Sep. 25, 2022

(65) Prior Publication Data

US 2023/0030946 A1    Feb. 2, 2023

Related U.S. Application Data

(63) Continuation-in-part of application No. 17/485,616, filed on Sep. 27, 2021, now abandoned.

(60) Provisional application No. 63/084,871, filed on Sep. 29, 2020.

(51) Int. Cl.
  *H04R 1/10*     (2006.01)
  *H03K 17/95*    (2006.01)
  *H04R 5/033*    (2006.01)

(52) U.S. Cl.
  CPC ............ *H04R 1/10* (2013.01); *H04R 5/0335* (2013.01); *H03K 17/95* (2013.01)

(58) Field of Classification Search
  CPC ......... H04R 1/10; H04R 5/0335; H03K 17/95
  See application file for complete search history.

(56) References Cited

U.S. PATENT DOCUMENTS

| | | | |
|---|---|---|---|
| 3,862,379 | A | 1/1975 | Pless |
| 4,010,340 | A | 3/1977 | Palmaer |
| 4,287,614 | A | 9/1981 | Lonnstedt |
| 4,375,702 | A | 3/1983 | Lundin |
| 4,391,000 | A | 7/1983 | Lonnstedt |
| 4,677,678 | A | 6/1987 | McCutchen |
| 5,144,678 | A | 9/1992 | Lenz |
| 7,853,035 | B2 | 12/2010 | Tsunoda et al. |

(Continued)

FOREIGN PATENT DOCUMENTS

| | | |
|---|---|---|
| CN | 101365252 A | 2/2009 |
| JP | 08186885 A * | 7/1996 |

(Continued)

OTHER PUBLICATIONS

Translation of JP08186885A; Mano ; Jul. 16, 1996.*
International Search Report and Written Opinion issued in PCT/US2022/076986, dated Dec. 28, 2022, 9 pages.

*Primary Examiner* — Andrew Sniezek
(74) *Attorney, Agent, or Firm* — Wang Hardoon, P.C.

(57) ABSTRACT

Electronic headphones that are operational when worn or placed on the head of a wearer and are non-operational when the electronic headphones are not worn. In exemplary embodiments, one or more sensors in the electronic headphones may detect this change of position of the earcups/pivot arms of the headset which indicates the wearer is no longer wearing the electronic headphones and put the electronic headphones in a non-operational state. Correspondingly, when placed on the head of a wearer, the sensor(s) detect the change of position of the electronic headphones which indicates the wearer is wearing the electronic headphones and puts the electronic headphones in an operational state.

15 Claims, 6 Drawing Sheets

(56) References Cited

U.S. PATENT DOCUMENTS

| | | | |
|---|---|---|---|
| 8,422,718 | B2 | 4/2013 | Santiago |
| 8,605,931 | B2 | 12/2013 | Amsel |
| 9,339,075 | B2 | 5/2016 | Ratliff |
| 9,486,027 | B2 * | 11/2016 | Dey ......................... H04Q 9/00 |
| 10,419,838 | B1 * | 9/2019 | Criswell .............. H04R 1/1041 |
| 11,051,096 | B1 | 6/2021 | Pournik |
| 11,109,135 | B1 | 8/2021 | Aparicio et al. |
| 2013/0202126 | A1 | 8/2013 | Chen et al. |
| 2021/0084401 | A1 | 3/2021 | Smiechowski et al. |

FOREIGN PATENT DOCUMENTS

| | | |
|---|---|---|
| WO | 2017069961 A1 | 4/2017 |
| WO | 2019195288 A1 | 10/2019 |

* cited by examiner

HEADPHONE APPARATUS AND METHODS FOR CONFIGURATION-BASED POWER SWITCHING

PRIORITY

This application is a continuation-in-part of and claims the benefit of priority to U.S. patent application Ser. No. 17/485,616 entitled "METHOD OF AUTOMATICALLY CHANGING POWER ON/OFF STATE OF ELECTRONIC HEADPHONES OR ELECTRONIC HEARING PROTECTION EARMUFFS WHEN PLACED ON OR REMOVED FROM THE HEAD OF THE USER" filed Sep. 27, 2021, which claims the benefit of priority to U.S. Provisional Patent Application No. 63/084,871, entitled "METHOD OF AUTOMATICALLY CHANGING POWER ON/OFF STATE OF ELECTRONIC HEADPHONES OR ELECTRONIC HEARING PROTECTION EARMUFFS WHEN PLACED ON OR REMOVED FROM THE HEAD OF THE USER", filed Sep. 29, 2020 each of the foregoing incorporated herein by reference in its entirety.

COPYRIGHT

A portion of the disclosure of this patent document contains material that is subject to copyright protection. The copyright owner has no objection to the facsimile reproduction by anyone of the patent document or the patent disclosure, as it appears in the Patent and Trademark Office patent files or records, but otherwise reserves all copyright rights whatsoever.

TECHNICAL FIELD

This disclosure relates generally to the field of electronic headphones and electronic hearing protectors. More particularly, the present disclosure relates to configuration-based power switching in electronic headphones and electronic hearing protectors.

DESCRIPTION OF RELATED TECHNOLOGY

Headphones and earmuffs are used to provide sound amplification and hearing protection for wearers. Headphones are a pair of small loudspeaker drivers worn on or around the head over a wearer's ears. Headphones let a wearer listen to an audio source privately, in contrast to a public loudspeaker, which emits sound into the open air for anyone nearby to hear. Circumaural ("around the ear") and supraaural ("over the ear") headphones use a band over the top of the head to hold the speakers in place. Another type, known as earbuds or earpieces consist of individual units that plug into the wearer's ear canal. A third type are bone conduction headphones, which typically wrap around the back of the head and rest in front of the ear canal, leaving the ear canal open.

Electronic headphones are used for a variety of purposes including listening to music, watching movies, or gaming, when recording audio, etc. The need for sound protection or isolation when performing these activities may be desirable or undesirable and the electronic headphones may be designed to accommodate a wearer's desired use. For example, the electronic headphones may include open-backed headphones which may allow the sound produced to be more natural and clearer. Open-backed headphones may also be cooler for a wearer as they allow heat to vent around a wearer's ears. Though, open-backed headphones do not provide sound isolation or protection. In contrast, closed-backed headphones are sealed around the back and allow sound out of the ear cups where they can reach the ear of a wearer. This may yield better isolation and less sound leakage than open-backed headphones.

Exposure to loud noise kills the nerve endings in the inner ear. Additional exposure will result in more dead nerve endings. The result is permanent hearing loss that cannot be corrected through surgery or with medicine. Noise-induced hearing loss limits the ability to hear high frequency sounds and understand speech, which may impair the ability to communicate. Specifically, sound over 85 adjusted decibels (dBA) for a prolonged period can permanently damage hearing. Sounds over 130 decibels (dB) can permanently damage hearing instantly. Accordingly, the Occupational Safety and Health Administration (OSHA) requires employers to implement a hearing conservation program when noise exposure is at or above 85 dB averaged over 8 working hours, or an 8-hour time-weighted average (TWA). One part of a hearing conservation program is the use of hearing protection devices like hearing protection earmuffs. Hearing protection earmuffs have cups lined with sound-deadening material which are worn as hearing protection. Hearing protection earmuffs are frequently used by industrial workers in loud environments such as construction sites, airfields, and railyards. For use on construction sites, for example, these earmuffs may be clipped onto the sides of a hard hat. Other earmuffs may use a headband like typical headphones.

Unsuppressed gunshots can reach incredibly high volumes of between 140-190 dB. This means hearing damage is almost inevitable in an environment with a lot of gun fire; such as a dynamic shooting range without sufficient hearing protection. Hearing protection earmuffs are frequently used for hearing protection when conducting activities such as hunting or shooting at a range. As a result, protective earmuffs may be used by law enforcement and the military for use during training as well as combat.

Some manufacturers combine headphones with hearing protection earmuffs, allowing the wearer to listen to music, communications, or other audio source while also enjoying protection or isolation from ambient noise.

One problem with headphones and electronic earmuffs is that they must be manually powered off when removed from the wearer's head. If the wearer forgets to power the headphones off, the headphones will continue to draw power and drain batteries or waste electricity. Leaving the device powered-on can drain the battery making them unusable when the wearer wishes to use the device again. Due to the unnecessary power drain, batteries may need to be replaced/recharged before use may resume or the length of time the wearer can use the device in the next session may be reduced. Total battery depletion will also damage rechargeable batteries or cause battery leakage within the headphones.

Manufacturers of headphones and electronic earmuffs have addressed battery life issues by increasing the size of the battery and therefore the battery life of the device. Such efforts, however, increase the weight and size of the device to accommodate the additional battery capacity making the device more awkward for a wearer. Some headphones include a timed shut-off feature where the device is turned off after a period of inactivity (e.g., 4 hours). Timed shut-off, however, may needlessly drain many hours of battery life or inadvertently power down a device in-use. Additionally, timed shut-off is not useful in turning the device on.

In time-critical situations, powering on and off electronic headphones and electronic hearing protectors can consume valuable time. Law enforcement, military, fire, EMT, and civilian persons responding to emergency situations requiring headphones (such as shootings, fires, loud venues, home defense, and emergency personnel running lights and sirens en route to an emergency) may be better served by headphones with an automatic power on/off function.

Mechanical automatic power on/off solutions have been attempted. As an example, U.S. Pat. No. 3,862,379 to Pless utilizes a spring-operated switch contained in the on-ear headphone. The spring-operated switch is activated by exerting pressure on the wearer's ear. U.S. Pat. No. 4,677,678 to McCutchen utilizes a complex, bulky, and impractical mechanism on the headband and ear cup of the device. U.S. Pat. No. 5,144,678 to Lenz utilizes a microswitch located inside the earcup padding of the headphones. Lenz further describes an electronic switch that detects when an actuator or sensor touches the skin of a wearer by detecting current flow between a sensor device and the person's body. Unfortunately, these mechanical solutions are bulky, prone to breakage, or exert an uncomfortable and unnecessary force on a wearer to ensure they are still wearing the headphones. The electronic switch of Lenz requires direct contact with the wearer's (hairless) skin limiting the ease of use of the headphones.

As a result of these faults, there are no mainstream headphones which have an automatic-on/off feature that toggles power of the device on and off when placed on and removed from the head. In the case of wireless headphones, this adds an extra step before the wearer can use the headphones, frequently requiring the wearer to cycle through power on/off and wireless pairing modes before the device can be properly powered on. In the case of most electronic hearing protectors, the wearer must power on the device and select the appropriate volume frequently using the same dial, a process which requires the use of the hands, and may take a significant amount of time to accomplish as the wearer tries to determine whether or not the power is on, while selecting an appropriate volume.

DETAILED DESCRIPTION

Figure 1:
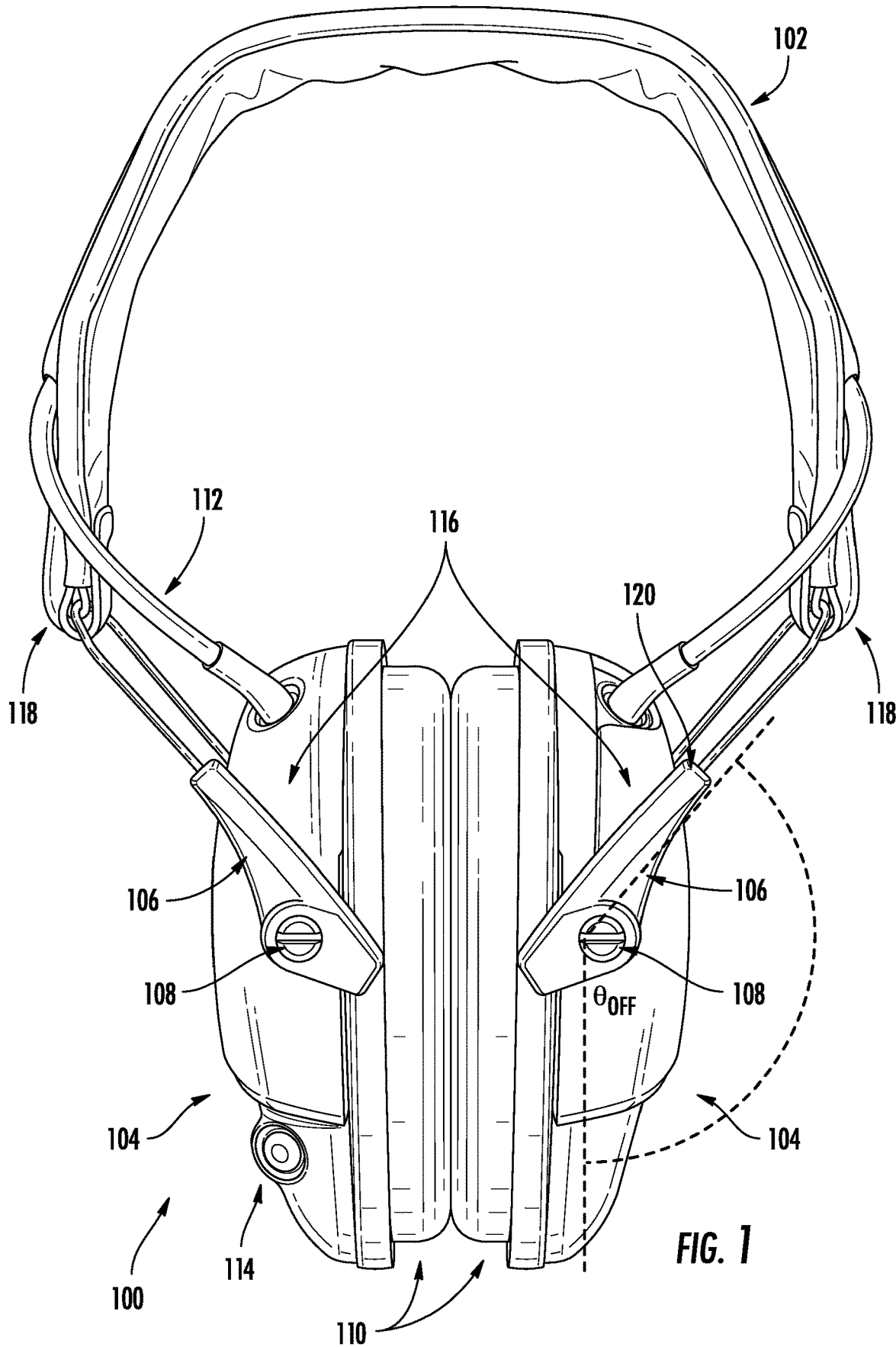
FIG. 1 depicts electronic headphones in the "power off" position according to aspects of the present disclosure.

In the following detailed description, reference is made to the accompanying drawings which form a part hereof wherein like numerals designate like parts throughout, and in which is shown, by way of illustration, embodiments that may be practiced. It is to be understood that other embodiments may be utilized, and structural or logical changes may be made without departing from the scope of the present disclosure. Therefore, the following detailed description is not to be taken in a limiting sense, and the scope of embodiments is defined by the appended claims and their equivalents.

Aspects of the disclosure are disclosed in the accompanying description. Alternate embodiments of the present disclosure and their equivalents may be devised without departing from the spirit or scope of the present disclosure. It should be noted that any discussion herein regarding "one embodiment", "an embodiment", "an exemplary embodiment", and the like indicate that the embodiment described may include a particular feature, structure, or characteristic, and that such particular feature, structure, or characteristic may not necessarily be included in every embodiment. In addition, references to the foregoing do not necessarily comprise a reference to the same embodiment. Finally, irrespective of whether it is explicitly described, one of ordinary skill in the art would readily appreciate that each of the particular features, structures, or characteristics of the given embodiments may be utilized in connection or combination with those of any other embodiment discussed herein.

In the description, relative terms such as "lower," "upper," "horizontal," "vertical," "above," "below," "up," "down," "bottom," "top," "front," "rear," "sides," "inward," "outward," as well as derivatives thereof (e.g., "horizontally," "downwardly," "upwardly," etc.) should be construed to refer to the orientation as then described, as would be worn or used by a typical wearer, or as shown in the drawing under discussion. These relative terms are for convenience of description and do not require that the apparatus be constructed or operated in a particular orientation. Terms concerning attachments, coupling and the like, such as "connected," "coupled," and "interconnected," refer to a relationship wherein structures are secured or attached to one another either directly or indirectly through intervening structures, as well as both movable or rigid attachments or relationships, unless expressly described otherwise.

Various operations may be described as multiple discrete actions or operations in turn, in a manner that is most helpful in understanding the claimed subject matter. However, the order of description should not be construed as to imply that these operations are necessarily order dependent. In particular, these operations may not be performed in the order of presentation. Operations described may be performed in a different order than the described embodiment. Various additional operations may be performed and/or described operations may be omitted in additional embodiments.

Example Operation

Various embodiments of the present disclosure address the disadvantages described above with an electronic headphone set including a pair of ear cups with a head band interconnecting the ear cups. At least one of the ear cups is movable between a usable position and an unusable position, and electronic circuitry is connected to the ear cups. In some embodiments, a switch (e.g. pivot arm) interconnects at least one ear cup to the head band and is operable to enable the electronic circuitry when in the usable position and to disable the electronic circuitry when in the unusable position. The switch may activate a sensor. The sensor is triggered by a triggering device located in another component (e.g., a pivot arm/or headband) of the electronic headphones when the triggering device and sensor are in proximity when in the "on" position (and not when in the "off" position).

Aspects of the present disclosure are directed to electronic headphones and/or electronic sound protection earmuffs (collectively referred to as electronic headphones). The electronic headphones are operational (e.g., powered-on/in a high-power state) when worn or placed on the head of a typical wearer and are non-operational (e.g., powered off) when the electronic headphones are not worn or removed from the head of the wearer. The benefits of certain embodiments provide automatic power on/off functionality for electronic headphones—by sensing when the electronic headphones are capable of being worn and providing power to the electronic headphones when in that configuration and turning off power to the electronic headphones when in a different configuration. Some embodiments, such functionality is electronically passive and therefore do not require constant power use despite being automatic.

Typically, in electronic headphones, the earcups swivel and/or the headband flexes to different positions to accommodate various wearer head shapes and positions of wear. This movement ensures a comfortable wear, effective sound resonance, and hearing protection for wearers of the electronic headphones. In some electronic headphones, the headset collapses/folds into a smaller footprint for non-operational storage. In other headsets, the earcups will spring together when removed from a wearer's head.

When the wearer removes the headphones, one or more proximity sensors in the earcup(s) and/or pivot arm(s) may detect a change of position of the earcups/pivot arms of the electronic headphones and put the device in a non-operational (no/low-powered) state. Correspondingly, when the electronic headphones are placed on the head of the wearer the proximity sensor(s) detect the change of position of the earcups/pivot arms of the headset and puts the device in an operational (on/high-powered) state. This automatic detection may make the electronic headphones simpler and easier to use which may save time in an emergency. Automatic detection may also save power/battery life compared to present power saving solutions allowing the devices to be used without recharging or changing batteries for longer period. Further, automatic detection may be easier or faster for a user to place the device in a powered or unpowered state. Combined, a wearer may be more likely to wear the electronic headphones when in situations with dangerous levels of noise.

Automatic detection may be detection of the state or configuration of the device without wearer instruction/interaction (e.g., pressing an "on" button). Automatic detection may be classified as electrically active or electrically passive. Exemplary embodiments of the present disclosure may use automatic detection that is electrically active or electrically passive. An electrically passive automatic detection is where detection is performed without any power use/drain. One example of electrically passive automatic detection is a reed switch detecting a mechanical pivot position of a component of the electronic headphones. the reed switch may detect the presence or absence of a magnetic triggering device without consuming any additional power (e.g., from the battery of the electronic headphones). An electrically active automatic detection is where detection is performed using a powered process to perform a test. One example of electrically active automatic detection is a Hall effect sensor detecting a mechanical pivot position of a component of the electronic headphones. The Hall effect sensor may output voltage based on a detected presence or absence of a magnetic triggering device which may be interpreted by a controller on the electronic headphones. Other examples of electrically active automatic detection include sensors such as motion sensors, an infrared sensor, an accelerometer, a skin conductivity sensor which output data to be interpreted by a controller.

Further, the use of magnetic proximity sensors, motion sensors, or a sealed button system may provide solutions that are provides water and dust resistance to the electronic headphones. For example, in an implementation with exposed electrical contacts, the electrical contacts when exposed to the elements can corrode or short circuit the electronic headphones when wet.

FIG. 1 depicts electronic headphones 100 in a non-operational/"power off" position. The electronic headphones 100 may include a headband 102 which connects ear cups 104 via pivot arms 106 at rotary hinge 108. Each ear cup 104 has an ear pad 11o which fit on or over the ears of a wearer. Circuitry in each ear cup 104 may be connected via cable 112 that runs along the headband 102. One ear cup 104 includes an audio-in port 114 for accepting auxiliary audio input from an audio source.

The non-operational position may be determined based on the proximity of certain components or portions of components of the electronic headphones 100. As used herein, "proximity" refers to two components being within a threshold distance or a threshold magnetic field. The threshold distance/magnetic field may be based on the location of the triggering and sensor devices (on e.g., pivot arm 1o6) and their movement from an operational to a non-operational position and normal variation in the component distances based on wearer geometry. The location may be set based on, e.g., the magnetic field of a triggering device and a sensitivity of a sensor device. For example, a magnet may be positioned in a pivot arm 106 of the electronic headphones 100 (at, e.g., location 120) and a reed switch positioned in an adjacent ear cup 104 of the electronic headphones 100 (at e.g., location 116). The placement of the magnet and the reed switch may be such that the magnetic field of the magnet will activate the reed switch when the electronic headphones 100 are in a usable (and safe) position on the head of the vast majority of typical wearers of the electronic headphones 100 (e.g., 95%+ of adult heads or 95% of heads within a particular size band of the electronic headphones) and not activated when in a standby or storage configuration or off the head of typical wearers.

The electronic headphones 100 includes a headband 102, generally comprised of a flexible, elastic, or springy material that allows the electronic headphones 100 to conform or clamp onto the wearer's head. The headband 102 holds the ear cups 104 in place on the head of the wearer. In some examples, the headband 102 is made from a hard thermoplastic or metal. To provide additional comfort to the wearer, the headband 102 may include padding/cushioning over the harder materials. The headband 102 is typically in an open loop or horse-shoe shape and configured to flex outward (from the center of the loop/horseshoe) from the ends 118. The headband 102 may flex when being placed on the head of a wearer to fit ear cups 104 on/over the ears of the wearer. Once the ear cups 104 are placed on/over the ears of the wearer, the ear cups 104 may be released and the ends 118 of the headband 102 may flex toward the center of the loop/horseshoe to create light tension on the head of the wearer.

The headband 102 includes an outer covering. The outer covering may be made of leather, cotton, nylon, vinyl, or a mix of materials. The outer covering may be a soft material as it touches and rubs against the head of the wearer. The outer covering may cover headband 102 and include an area for cable 112 that connects ear cups 104 to run through so as not to get tangled or caught on other objects during use or storage. Padding/cushion in headband 102 may be contained within the outer covering.

In some examples, the headband 102 is configured to fit on the crown of the head of a wearer. In some examples, the headband 102 fits (or has a supplemental band/strap that fits) along the rear side of the head or the rear side of the neck of the wearer.

The electronic headphones 100 includes ear cups 104. The ear cups 104 are generally constructed of plastic or metal material and contains the inner workings of the headphone. The inner workings may include electroacoustic transducers, which convert an electrical signal to a corresponding sound. Generally, the electronic headphones 100 include a speaker, amplification/audio circuitry, noise cancellation microphones and supporting circuitry, a battery (or a battery connectable housing), sound insulation material, and other components. Circuitry within the ear cups 104 may be located around location 116. The ear cup 104 may also contain a proximity/configuration/orientation/motion sensor and corresponding circuitry designed to sense motion and control the flow of power from the power source.

Each ear cup 104 includes an ear pad 11o. The ear pad 11o is generally constructed of leather, vinyl, foam, rubber, silicone, and/or other material deigned to support the headphones over the ears of the wearer, providing comfort, sound isolation, and supporting the electronic headphones 100 on the head of the wearer.

The outer housing of ear cup 104 is generally constructed from a hard plastic or metallic material. The outer housing may include one or more input port/holes/cutouts. The shape of the outer housing of the ear cup 104 may include a cutaway to provide stock clearance for use with long guns/rifles (on one or both ear cups 104). As illustrated, the outer housing of ear cup 104 includes an audio-in port 114 for accepting auxiliary audio input from an audio source such as a phone, music device, radio scanner, or other audio source. The audio-in port 114 may include a port that accepts a ¼ inch (6.35 mm) or ⅛ inch (3.5 mm) auxiliary jack. Additionally, cutouts for cable 112 electronically coupling ear cups 104 are included in the outer housing of each ear cup 104. The outer housing may include one or more cutouts for input dials/switches including a volume/power dial for the electronic headphones 100 to tune the audio-in volume or the attenuation of noise-cancellation. Buttons to toggle noise-cancellation may be cut out of the outer housing of ear cups 104. Lights, such as one or more LEDs, may be cut out of the outer housing of ear cups 104 to provide visual output to a wearer.

The outer housing may additionally have cutouts/holes for microphone input. The microphone input may be electronically coupled to noise cancellation circuitry within ear cup 104. Noise cancellation circuitry may be used to protect the hearing of a wearer or to provide an improved, isolating listening experience depending on the use case for the electronic headphones 100.

As a brief aside, there are two different types of hearing protection earmuffs used to protect the wearer from loud sounds based on the acoustical properties and materials used to create them: passively attenuating and actively attenuating earmuffs. Passively attenuating earmuffs rely solely on sound deadening properties of the insulating materials in the ear cup 104. The ability of a passive earmuff to attenuate a signal is based on the materials used. The material and structure of the earmuff device is used to decrease the sound level that is transmitted through the ear canal. Materials, such as a cupped foam coated in hard plastic, will block sound due to the thick and dampening properties of the foam. The sound protection usually comes from acoustic foam which absorbs sound waves by increasing air resistance, thus reducing the amplitude of the waves. The energy is transformed into heat.

Active earmuffs have additional electronic components and microphones that allow the wearer to control their access to communication while attenuating background noise. When in loud, hazardous settings, the wearer may still be required to listen to outside sources, such as machinery work, their supervisor's commands, or talk to their colleagues. While the material and design of the muff allows for attenuation (e.g., 22-30 or greater dB noise reduction rating (NRR)), the wearer has the option to allow some sounds in that are beneficial for awareness of their surroundings or are necessary for their job. These earmuffs may incorporate a volume control to increase and decrease the attenuation.

Active noise reduction earmuffs incorporate electronic noise cancellation or active noise cancellation to attenuate (roughly 26 dB NRR) low frequency noise. A microphone, circuit, and speaker inside the ear cups 104 of the electronic headphones 100 are used to actively cancel out noise. As a signal enters the microphone, the electronics within the electronic headphones 100 cast a signal back that is 180° out of phase with the signal, thus "cancelling" this signal. This opposing signal reduces the amplitude of the waveform and reduces the signal. Active noise reduction in electronic headphones 100 are designed to protect against a continuous signal, particularly low frequency sounds, such as diesel locomotives, heavy tractors, or airfields.

The rotary hinge 108 connects the ear cup 104 to the pivot arm 106 or headband 102 of the electronic headphones 100. The rotary hinge 108 may include a joint, hinge, or pivot which allows the angle of the electronic headphones 100 to adjust to the wearer, and can provide telescoping, hinging, and angle adjustment features as needed to suit the specific model or application of the electronic headphones 100. In some examples, such as in the illustrated embodiment, each ear cup 104 has two rotary hinges 108. Each rotary hinge 108 connects a separate pivot arm 106 to each ear cup 104. In other examples, a single rotary hinge 108 may connect the ear cup 104 to the headband 102. Artisans of ordinary skill in the art will readily appreciate other constructions and hinge/mounting methods that may be utilized. For example, rotary hinge 108 may include an adjustable clamp that can adjust the position of the ear cup 104 with the headband 102 (or pivot arm 106).

The ear cup 104 may be configured to pivot/rotate about one or more rotary hinge 108. This movement allows the ear cup 104 to conform to the head of the wearer for comfort and an effective seal (where appropriate for the intended use case e.g., hearing protection or sound isolation). Certain positions of ear cup 104 may be in a usable position.

As used herein, an "operational position," and "usable position" is a position or relative configuration of one or more components (e.g., ear cup(s), pivot arm(s), headband, accessory connector, swivel mechanism, swing arm, etc.) of the electronic headphones that indicate that the electronic headphones are being worn or are capable of being worn by a wearer. When in an operational position, a sensor device may enable electronic circuitry within the electronic headphones. As used herein, a "non-operational position," and an "unusable position" is a position or relative configuration of one or more components (e.g., ear cup(s), pivot arm(s), headband, accessory connector, swivel mechanism, swing arm, etc.) of the electronic headphones that indicate that the electronic headphones are not being worn or are not capable of being worn by a wearer. When in a non-operational position, a sensor device may disable some or all electronic circuitry within the electronic headphones.

The electronic headphones 100 are not capable of being worn by a typical wearer when in one or more configurations. For example, when ear pads 110 of ear cups 104 are pressed together, the headband 102 is in an unflexed configuration, and the pivot arms 106 are in pre-designated angles with respect to the ear cups 104/the rotary hinge 108/the ends 118 of the headband 102. In other examples, the headband 102 may include one or more hinges along the length which may rotate and connect to the ear cups 104/the rotary hinge 108. For example, the headband 102 may include a single hinge in the center or a hinge on each side of the headband 102, between the center of the headband 102 and the ends 118. Likewise, the electronic headphones 100 are capable of being worn by a wearer when in one or more configurations. These configurations may include when ear pads 110 of ear cups 104 are separated, the headband 102 is in a flexed position, and pivot arms 106 are in other pre-designated angles with respect to the ear cups 104/the rotary hinge 108/the ends 118 of the headband 102. Aspects of the present disclosure take advantage of these configuration differences to place one or more sensor devices (in combination with one or more triggering devices) in one or more locations on or about the electronic headphones 100. These sensor devices turn-on or allow electronic components of the electronic headphones 100 to power-on or remain powered/operational when in or placed in an operational position. When in or placed in a non-operational position, the sensor devices may turn off or remain off when in or placed in a non-operational position.

In some embodiments, when not in use, the headband 102, ear cups 104, pivot arms 106 and/or rotary hinge 108 may be placed in or return to an unflexed/resting state by a wearer or automatically by virtue of the flexible/spring-like nature of the components. Aspects of the present disclosure take advantage of the ability of the electronic headphones to revert to a different/standby position when removed from active use through placement of one or more sensors/triggering devices on the electronic headphones 100.

The pivot arms 106 connect the headband 102 to the rotary hinge 108 on the ear cups 104. The pivot arms 106 may be made of a rigid plastic or metal or a mix of materials. As the ear cups 104 and headband 102 flex to conform to a wearer putting on and taking off the electronic headphones 100, the pivot arms 106 pivot about rotary hinge 108 as the pivot arms 106 connect the headband 102 and ear cups 104. The rotary hinge 108 may include a screw or axle to allow the pivot arms 106 to rotate.

One or more pivot arm 106 may contain a triggering device located on or about location 120 corresponding to a sensor device located on or about location 116 on/within ear cup 104. The triggering device may trigger the sensor wirelessly, without requiring a physical connection. For example, the triggering device may include a magnet and the sensor device may include a magnetic proximity sensor such as a reed switch or Hall Effect sensor. In other examples, pivot arm 106 may include an interface triggering device, located on or about location 120, designed to interact with a microswitch, button, sensor, or electrical interface located on or about location 116 on/within ear cup 104. For example, pivot arm 106 may flip/activate a physical switch on ear cup 104. This activation may put the physical switch into an operational position as the ear cup 104 and the pivot arms 106 move as a wearer puts on the electronic headphones 100. Alternatively, the activation may put the physical switch into a non-operational position as the ear cup 104 and the pivot arms 106 move as the wearer removes the electronic headphones 100.

Various aspects of the present disclosure select an operational/active/worn state and a non-operational/inactive/unwearable state based on a positional shift between a triggering device and a sensor device. More broadly, any components or combination of components that can sense a positional shift may be substituted with equal success by artisans of ordinary skill in the related arts, given the contents of the present disclosure. Thus, there may be multiple locations across the ear cups 104 that are suitable to place the sensor device and multiple locations on the pivot arms 106 or headband 102 that move into and out of alignment (during use and non-use respectively) with the triggering device. However, in some examples, the sensor device may be installed nearer to the electronic circuitry than the triggering device and/or physically coupled to the electronic circuitry of the electronic headphones 100. Placement of the sensor device and triggering device may therefore be installed in a range of locations such that the location of the triggering device can cause the sensor device to be placed in an "on" or "active" state when the electronic headphones 100 is in an operational position on the head of a wearer and the triggering device does not cause the sensor device to be placed in an "on" or "active" state when the electronic headphones 100 is in a non-operational position. Placement of the triggering device and the sensor device within electronic headphones 100 may be based on other operational considerations, e.g., proximity or access to internal circuitry, weight balancing between ear cups 104, and/or space considerations for the circuitry for the sensor device.

In one exemplary embodiment, the combination of the triggering device and sensor device are used to control the flow of power from a power source. The power source may be coupled to the other circuitry within the electronic headphones 100. In some embodiments, the power source includes one or more rechargeable battery (e.g., a lithium-ion battery). In other embodiments, the power source includes a housing to hold one or more disposable (e.g., alkaline, AA, AAA, etc.) batteries. The housing may electrically couple one or more batteries.

Alternatively, a motion sensor and corresponding circuitry designed to sense motion and control the flow of power from the power source may be utilized to power the device off when motion is not sensed for a period of time. The period of time may be a few (e.g., five) minutes or multiple hours depending on the use case of the electronic headphones 100. For example, when hunting a hunter may remain still for a long period of time waiting to take a shot whereas for exercise uses, a wearer may be constantly/intermittently moving and a shorter power-down time may be useful.

In an alternative embodiment, the triggering device and sensor device enable particular electronics on the electronic headphones 101 (e.g., noise cancellation) but leave other electronics active (e.g., a battery status LED or network connectivity).

In an alternative embodiment, instead of (or in addition to) the triggering device, a physical-mechanical interface may be designed on the pivot arm 106 around location 120, with a microswitch designed around location 116 on ear cup 104 (replacing or in addition to the triggering device). In some examples, the physical-mechanical interface may include a bulge, projection or notch configured to trigger a button, switch, or sensor. When the electronic headphones 100 are placed on the wearer's head, the microswitch and physical-mechanical interface are be brought into alignment, and the physical-mechanical interface will depress or slide the microswitch, powering the electronic headphones 100 on. Correspondingly, when removed from the head of a wearer, the microswitch on the pivot arm 106 is depressed powering the electronic headphones 100 off.

In other embodiments, one or more sensors, paired with a microcontroller, may be used to control activation of the electronic headphones 100. A microcontroller, paired with a sensor, in some examples, may provide approximately 1 month of battery life and provide automatic power on/off functionality. A sensor (alone or in combination with a paired microcontroller configured to interpret the output of the sensor) may be used to sense an orientation or positional difference between components. Positional/orientation differences may be sensed with proximity sensors, bare metal contacts, etc. Additionally, a microcontroller paired with a sensor may be used to sense the presence of a wearer's head rather than a positional difference between components. Other sensors may sense motion of components of the electronic headphones 100. Presence may be sensed with a motion sensor, an infrared sensor, an accelerometer, a skin conductivity sensor, or other sensors to detect when electronic headphones 100 are on the wearer's head and power the electronic headphones 100 on or off. In one example, motion sensors and a microcontroller may activate electronic circuitry in the electronic headphones 100 when motion is detected. In another example, infrared sensors and a microcontroller activate electronic circuitry in the electronic headphones 100 when heat from the wearer's head is detected, or when an infrared (IR) beam is detected. In a further example, position sensors may sense the vertical orientation of the headphones and activate electronic circuitry in the electronic headphones 100. In another example, accelerometers may be used to sense motion and position and activate electronic circuitry in the electronic headphones 100. In an additional example, skin conductivity sensors placed on ear pads 110, or headband 102 may be used to detect when the electronic headphones 100 are placed on the head of a wearer and activate or deactivate the electronic circuitry in the electronic headphones 100. However, these sensors and microcontrollers have a passive power draw that may be too great for long term standby mode. Additionally, the motion generated by transportation or carrying the electronic headphones 100 may cause unintended activation.

Additionally, rotary hinge 108, ear cups 104, and/or pivot arm 106 may include bare metal contacts that when in contact indicate the electronic headphones 100 are in an operational/non-operational position. A power source may be electrically coupled to a metal contact on one of the components (e.g., pivot arm 106, or a portion of rotary hinge 108) and electronic circuitry may be electrically coupled to another metal contact on a different component or part of the component (e.g., ear cup 104, or a different portion of rotary hinge 108). The metal contacts are electrically couplable. The metal contacts are coupled when the electronic headphones 100 are in an operational position and not coupled when the electronic headphones 100 are in a non-operational position. For example, when the electronic headphones 100 are placed on the head of a wearer, metal contacts on e.g., ear cup 104 and pivot arm 106, come into alignment (from a non-aligned configuration), contacting each other and allowing the flow of electricity from the power source to the electronic circuitry.

As illustrated in the configuration of FIG. 1, the pivot arm 106 (with a triggering device located at location 120) is not proximate to a sensor device located at location 116 within the ear cup 104. In the "power-off" position, the sensor device (e.g., the magnetic proximity sensor, Hall Effect Sensor, microswitch, button, or similar sensor device) may interrupt the flow or cause the interruption of the flow of electricity from the power source. In typical use, the "power off" or inactive position is set when the electronic headphones 100 are not on the head of the wearer and not in active use.

As illustrated, headband 102 is in a resting (unstretched) position and ear pads 110 of ear cups 104 are together. Pivot arms 106 form a first angle ($\theta_{OFF}$) with a line parallel to the opening (ear pad 110) side of ear cup 104 at the rotary hinge 108 such that the triggering device on a pivot arm 106 does not activate/trigger the sensor device in ear cup 104. In some examples, one pivot arm 106 of the electronic headphones 100 has a triggering device and one ear cup 104 has a sensor device.

In other examples, a triggering device is placed on two (or more) pivot arms 106 and a sensor device is placed in both ear cups 104 of the electronic headphones 100. Where each of ear cups 104 have a separate sensor device, circuitry may require that both sensors be activated for the electronic headphones 100 to be in the power-on position. Implementing the activation methods on both sides of the electronic headphones 100 may ensure that one side of the electronic headphones 100 accidentally coming into alignment will not result in activation of the electronic headphones 100. Alternatively, circuitry may allow the electronic headphones 100 to be powered if only a single sensor of two or more sensors is activated.

In further examples, one or more ear cup 104 has a triggering device and one or more of the pivot arms 106 contains a sensor device. This configuration may be beneficial in examples where circuitry or power source for the electronic headphones 100 are off the ear cups 104, e.g., on the headband 102.

Additionally, multiple triggering and/or sensor devices may be placed at two or more portions of one side of electronic headphones 100 (e.g. with one ear cup 104). This may be useful in the electronic headphones 100 with many movable parts/configurations. As described with triggering devices and sensor devices placed in both ear cups 104; in some exemplary embodiments either one, some, or all of the sensor devices may need to be triggered to indicate the electronic headphones 100 are in a operational (e.g., wearable) configuration powering on the electronic headphones 100. Or, alternatively, one, some, or all of the sensor devices may need to be triggered to indicate the electronic headphones 100 are in a non-operational configuration powering off the electronic headphones 100.

In some embodiments, the position of the triggering device (or sensor device) may be fine-tuned by a wearer. A mechanism containing the triggering device may be shifted by a wearer to fine tune activation of a sensor. For example, the pivot arm 106 may include a rotary dial containing the triggering device. The rotatory dial may include a number of rotational stops selectable by a wearer. In some examples, the rotary dial includes a plastic knob. An indicator on the rotatory dial may indicate the location of the triggering device; a corresponding indicator may indicate the location of the sensor device. A wearer may align the triggering device with a sensor device by rotating the rotary dial when the electronic headphones 100 are worn to align the triggering device with a sensor device. When the wearer removes the electronic headphones 100, the triggering device will be out of alignment and consequently no longer in proximity with the sensor device powering off the electronic headphones 100. When the wearer puts on the electronic headphones 100 after an initial adjustment, the rotary dial may not need to be re-adjusted for the wearer, and the electronic headphones 100 may power on as the triggering device and sensor device are in alignment/proximity.

In another example, the pivot arm 106 or the headband 102 may include a channel with a slider mechanism containing the triggering device. An indicator on the slider may indicate the location of the triggering device; a corresponding indicator may indicate the location of the sensor device. The wearer is able to adjust the location of the triggering device by sliding the slider when the electronic headphones 100 are worn to align the triggering device with a sensor device. When the wearer removes the electronic headphones 100, the triggering device will be out of alignment and consequently no longer in proximity with the sensor device powering off the electronic headphones 100. When the wearer puts on the electronic headphones 100 after an initial adjustment, the slider does not need to be re-adjusted for the wearer.

As illustrated, electronic headphones 100 has a pair of components (e.g., ear cups 104, ear pads 11o, pivot arms 106, rotary hinge 1o8), on each side of headband 102. In other embodiments, certain components may only appear on one side of the headband 102/electronic headphones 100. For example, audio-in port 114 is shown as being on (only) one side of the electronic headphones 100. Internal (not illustrated) components, e.g., a triggering device, a sensor device, a power source, different parts of the internal circuitry, etc. may occur only on one ear cup 104 or on one portion of the electronic headphones 100.

Figure 2:
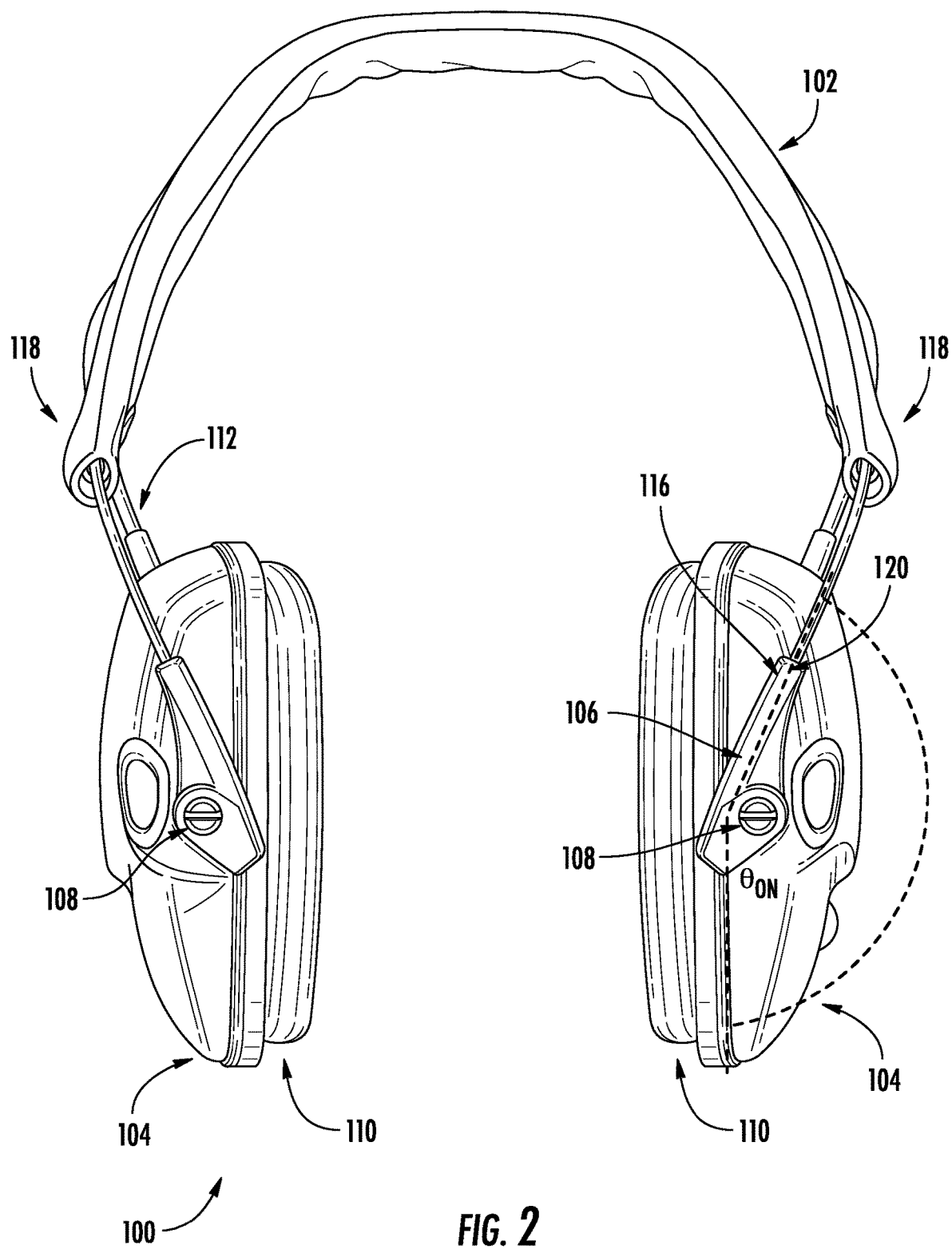
FIG. 2 depicts the electronic headphones in the "power on" position according to aspects of the present disclosure.

FIG. 2 depicts the electronic headphones 100 in the power-on position. The electronic headphones 100 are illustrated in the "power on" position when the electronic headphones 100 are placed in an operational position, for example, on the head of the wearer.

As illustrated in the configuration of FIG. 2, when in the power-on position the pivot arm 106 (with a triggering device at location 120) is in line with location 116. In this position, the sensor device will allow the flow (or a greater flow) of electricity from the power source. In typical use, the power-on or active position is set when the electronic headphones 100 are on the head of the wearer. As illustrated, headband 102 is in an expanded (stretched) position and ear pads 110 of ear cups 104 are spread apart. Pivot arms 106 form a second angle ($\theta_{ON}$) with a line parallel to the opening (ear pad 110) side of ear cup 104 at the rotary hinge 108 such that the triggering device on a pivot arm 106 activates/triggers the sensor device in ear cup 104. Due to the positions of the ear cups 104 and pivot arms when worn/in the active state, the second angle ($\theta_{ON}$) is greater than the first angle ($\theta_{OFF}$). In other configurations of the electronic headphones 100, $\theta_{ON}$ is a smaller angle than $\theta_{OFF}$.

To automatically activate/power-on electronic circuitry in the electronic headphones 100, a wearer puts on the electronic headphones 100 and the electronic headphones 100. In one example, the wearer grasps ear cups 104 and separates the ear cups 104. In another example, the wearer grasps the ends 118 of the headband 102 and flexes the ends 118 of the headband 102 outward. In a further example, the wearer grasps the pulls the ends 118 of the headband 102 or ear cups 104 to elongate a telescoping headband 102. The wearer places the headband 102 of electronic headphones 100 on the crown of the head of the wearer, positioning the ear cups 104 over the ears of the wearer. The wearer releases the ear cups 104/headband 102 causing the ear cups 104/headband 102 to contract/conform to the head of the wearer. In some examples, the wearer adjusts the length of the headband 102 by pulling on/pushing in the ear cups 104 causing the ear cups 104 to extend/retract from a telescoping portion of the headband 102. The new position and/or movement of the ear cups 104 and/or headband 102 causes the pivot arms 106 to move in relation to the ear cup 104. The movement of a triggering device in a pivot arm 106 activates a sensor device in the ear cup 104 powering on the electronic headphones 100.

To automatically deactivate/power-off electronic circuitry in the electronic headphones 100, a wearer removes the electronic headphones 100. In one example, the wearer grasps ear cups 104 and separates the ear cups 104 from their ears. In another example, the wearer grasps the ends 118 of the headband 102 and flexes the ends 118 of the headband 102 outward to separate the ear cups 104 from their ears. The wearer may then lift the electronic headphones 100 off their head. The ear cups 104 may be placed together and/or natural spring pressure on the headband 102 may return the electronic headphones 100 to a unflexed/resting non-operational position. In some examples, the ear pads 110 of the ear cups 104 may be pressed together (as illustrated in FIG. 1). The new position and/or movement of the ear cups 104 and/or headband 102 causes the pivot arms 106 to move in relation to the ear cup 104. The movement of a triggering device in a pivot arm 106 causes the triggering device to no longer be in proximity with a sensor device in the ear cup 104. The movement or detection of the loss of proximity deactivates a sensor device in the ear cup 104 powering off the electronic headphones 100.

Figure 3:
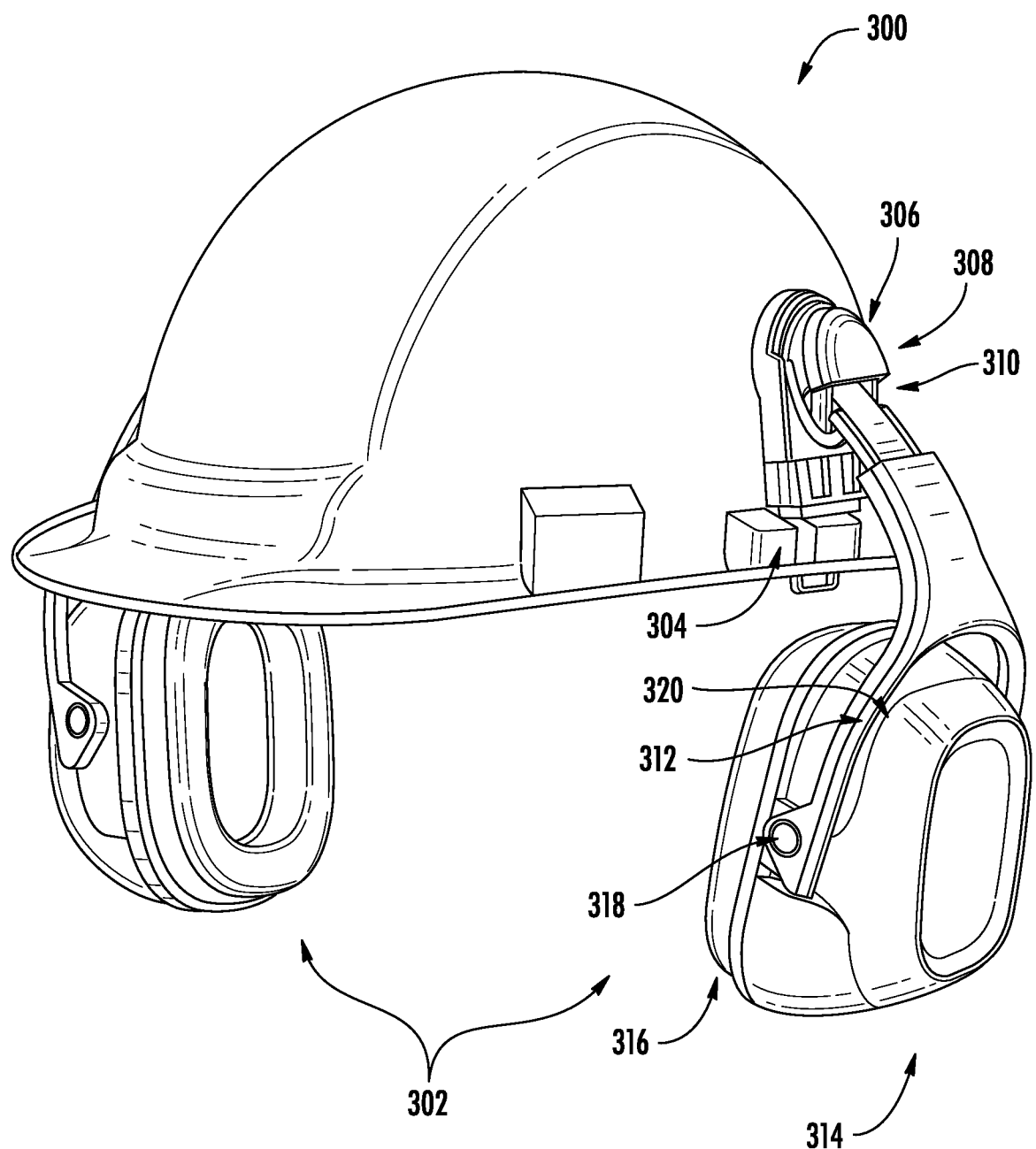
FIG. 3 illustrates a hard hat mounting of electronic headphones with an automatic power on/off function according to aspects of the present disclosure.

FIG. 3 illustrates a hard hat 300 mounting of electronic headphones 302 with an automatic power on/off function. Hard-hat mounted hearing protection is often used in construction or factory environments where hearing protection cannot have an over-head headband (as illustrated in FIGS. 1 and 2) due to interference from the hard hat 300.

The hard hat 300 is a protective helmet configured to protect a wearer's head from impacts and falling objects. While the hard hat 300 is illustrated as used in industrial or construction sites, other helmet types may be substituted with equal success such as a firefighter's helmet; combat helmet; climbing helmet, bicycle helmet, ski or paragliding helmet, etc. More generally, the illustrated configuration may be used with any headwear that inhibits wearing standard headphones with a headband seated on the crown of a wearer's head. The hard hat 300 may include a shell constructed out of any suitable material including molded thermoplastics, such as high-density polyethylene, or resins, such as polyetherimide. Other construction materials such as fiberglass, Kevlar, foam, metals, or a combination of materials may be used depending on the intended use of hard hat 300. The hard hat 300 may be lined with various materials such as padding or foam and may include a suspension liner system to affix hard hat 300 to the head of a wearer.

The hard hat 300 is configured to fit over the head of a wearer. The hard hat 300 is characterized by a front side on the side of a wearer's face when worn, a back side worn by/on top of the back of the wearer's head, and two sides on the sides of the ears of a wearer.

Hard hat 300 may have one or more accessory mounts 304 configured to attach various accessories. The accessory mount 304 may be a standard/universal accessory slot formed into the hard hat, which can mount accessories such as hearing protection headphones (earmuffs) such as electronic headphones 302, flashlights, or other accessories. The accessory mount 304 may be a 29 mm to 33 mm wide opening and be located on the sides of the hard hat 300. The accessory mount 304 may accept a clip inserted into the slot to secure an accessory. In other examples, accessory mount 304 may include a side rail for sliding accessory connectors that can accept an accessory connector 306 on the electronic headphones 302.

The electronic headphones 302 includes an accessory connector 306 removably connectable to the accessory mount 304 of the hard hat 300. The electronic headphones 302 may also include a swivel assembly 308, a swing arm 310, a pivot arm 312, and an ear cup 314 with an ear pad 316.

The accessory connector 306 may include a tongue or clip to interface with the accessory mount 304 of the hard hat 300. In other examples, accessory connector 306 may mounted to hard hat 300 via clips, clamps, suction cups, ties around the circumference of hard hat 300, threading a cord/webbing/zip tie through a loop or slot in hard hat 300, screws by drilling into hard hat 300, and/or use adhesives for permanent or semi-permanent attachment. In one exemplary embodiment, a wearer may install a clip mounting of accessory connector 306 to the accessory mount 304 on the hard hat 300 by snapping the clip into the slot of the accessory mount 304. In some embodiments, the clip mounting includes tabs for removal. A wearer may press on the tabs to release the clip on the accessory connector 306 from the accessory mount 304 on the hard hat 300.

The accessory connector 306 may be coupled to a swivel assembly 308 and/or a swing arm 310. The swivel assembly 308 allows the pivot arm 312 and ear cup 314 of the electronic headphones 302 to rotate substantially parallel to the sides of the hard hat 300 about the swivel assembly 308 or the accessory connector 306. The swivel assembly 308 may have one or more rotational stops that allows the electronic headphones to be stored in a non-operating position off the ears of a wearer of the hard hat 300. For example, the ear cup 314 may be rotated and locked in a non-operating position with the length of the swing arm 310 in a position substantially parallel to the brim of the hard hat 300 (as worn by a wearer), with the ear cup 314 pointed toward the front or rear of hard hat 300. The swing arm 310/ear cup 314 may be turned and locked in an operating position. The operating position may be characterized by the length of the swing arm 314/the ear cup 314 being in a position perpendicular to the brim of the hard hat 300. Swivel assembly 308 may include any suitable mechanism for rotating the electronic headphones 302 about the accessory connector 306 and can lock and hold the electronic headphones 302 in two or more positions, including an operating position and a non-operating position, at the rotational stops.

Swing arm 310 allows the pivot arm 312 and ear cup 314 of the electronic headphones 302 to be rotated toward and away from the wearer's ear out from the sides of the hard hat 300. The rotation of the swing arm 310 may have positional stops that allow the electronic headphones 302 to be stored in a standby or non-operating position off the ears of the wearer and a snug-fitting operating position. In some examples, the ear cup 314 may move from about 1 inch from the face/ear of a wearer to snugly fit on/over ear of the wearer. Swing arm 310 may include any suitable mechanism for swinging pivot arm 312 and ear cup 314 toward and away from the ear of a wearer of hard hat 300 and providing sufficient force to press the ear pad 316 of ear cup 314 onto the ear of the wearer. In combination, the swing arm 310 and the swivel assembly 308 allow the pivot arm 312 and ear cup 314 of the electronic headphones 302 to swing forwards (toward the front of the hard hat 300/face of the wearer) or backwards (toward the rear of the hard hat 300/rear side of the wearer) to a locked position substantially parallel to the ground (as worn by a wearer).

In an alternative embodiment, the swivel assembly 308 and the swing arm 310 may be a single mechanism, e.g., a ball and socket assembly.

The pivot arm 312 may be coupled to the accessory connector 306/swivel assembly 308 and/or a swing arm 310. Pivot arm 312 couples the accessory connector 306 to connection point 318 on the ear cups 314. As illustrated, pivot arm 312 may telescope to allow ear pad 316 of ear cup 314 to adjust and sit comfortably against/over the ear of a wearer.

Ear cup 314 may include electronic circuitry and a power source. A sensor device in ear cup 314, e.g., at location 320, may switch electrical operation of the electronic headphones 302 "on" and "off." In some embodiments, when in proximity of a triggering device, the sensor device allows electricity to flow through the electronic circuitry in the electronic headphones 302. The triggering device may be located in pivot arm 312. For example, the triggering device may include a magnet or a physical-mechanical interface and the sensor device may include a magnetic proximity sensor, reed switch, Hall Effect sensor, magnetoresistive (MR) sensor, microswitch, relay, button, or other sensor. In alternative embodiments, the sensor device allows power to flow through the electronic circuitry when not in proximity of the triggering device. As illustrated, the hard hat 300 is coupled to two separate electronic headphones 302. In some examples, the separate electronic headphones 302 are not electrically coupled. However, in some examples, the pair of electronic headphones 302 may be in wireless communication via e.g., a wireless network connection. Each of the electronic headphones 302 may contain a separate circuit board/electronic circuitry and power source (e.g., batteries) and operate independently. Likewise, each of the electronic headphones 302 may be powered-on and off independently. Accordingly, each of the electronic headphones 302 may have a separate sensor device to automatically power-on and off the electronic headphones 302 independently when in the presence/absence of a triggering device.

The automatic power on/off functionality of the electronic headphones 302 may be implemented as described above with respect to FIGS. 1 and 2. For example, a sensor device in the ear cup 314, when in proximity/contact with a triggering device in pivot arm 312, power on the electronic headphones 302. When the sensor device in the ear cup 314 is not in proximity/contact with the triggering device in pivot arm 312, the electronic headphones 302 the electronic headphones 302 are powered off.

Alternatively, the electronic headphones 302 automatic power on/off components (e.g., the sensor device and a triggering device) may be integrated into accessory connector 306. In one example, to provide automatic power on/off features, a triggering device and/or sensor device may be integrated into the accessory connector 306. When the electronic headphones 302 are placed on the wearer's ears, the sensor device may connect the power source to the load/electronic circuitry when in the presence of/connectivity with the triggering device. Pulling the electronic headphones 302/ear cups 314 away and/or rotating the electronic headphones 302/swing arms 310/ear cups 314 away from the ears into a non-operational position removes the sensor device from proximity/connectivity with the triggering device which disengages/deactivates the sensor device. In turn, the sensor device disconnects the power source from (or reduces the power available to) the load/electronic circuitry.

As described, a triggering device and sensor device pair may be placed in any of a number of possible configurations that indicate the electronic headphones 302 are in an operational (or, alternatively non-operational) position. A triggering device, for example, may be placed within the hard hat 300 to trigger a sensor device within the electronic headphones 302. The triggering device may be built into the hard hat 300 or separately affixed on to the hard hat 300. For example, a triggering device may be installed via a clip or insert into an accessory mount 304 or attached via a sticker/glue or other affixing mechanism to the hard hat 300 e.g., by the wearer. In one example, triggering device may be installed on or near the accessory mounts 304 and a sensing device may be placed on or near the accessory connector 306 of the electronic headphones 302. Thus, the electronic headphones 302 may be turned on when the accessory connector 306 is affixed to the accessory mounts 304 on the hard hat 300. In another example, a triggering device is affixed to a standby/storage configuration near the front or rear of the hard hat 300. The triggering device may thus indicate to a sensor device (in e.g., an ear cup 314) that the electronic headphone 302 is worn in a non-operational position and power off electronic circuitry within the electronic headphones 302.

To automatically activate/power-on electronic circuitry in the electronic headphones 302, a wearer installs the electronic headphones 302 onto the hard hat 300 and places the electronic headphones 302 in an operational position. In one example, the wearer inserts the accessory connector 306 of the electronic headphones 302 into the accessory mounts 304 on the sides of the hard hat 300. The accessory connector 306 may click into the accessory mount 304. Once installed, a wearer may place the hard hat 300 on their head. The wearer may position the electronic headphones 302 over their ears by grasping ear cups 314, the swing arm 310, or the pivot arm 312 and rotate the electronic headphones 302 about the accessory connector 306 or the swivel assembly 308 on the sides of to the hard hat 300. Additionally, the wearer may press, pull, or position the electronic headphones 302 over their ears or move/swing the electronic headphones 302 inward or outward with respect to the hard hat 300. The wearer may position the electronic headphones 302 by grasping ear cups 314 or the swing arm 310 or the pivot arm 312 using the accessory connector 306 or the swing arm 310. In some examples, the wearer adjusts the length of the swing arm 310 or the pivot arm 312 by pulling on/pushing in the ear cups 314 causing the ear cups 314 to extend/retract from a telescoping portion of the swing arm 310 or the pivot arm 312. The wearer is therefore able to position/adjust the position of the ear cups 314 over their ears so that the ear pads 316 enclose the ears of the wearer fully and create a seal tightly against their head. The new position and/or movement of the ear cups 314, the swing arm 310, or the pivot arm 312 causes the pivot arms 312 to move in relation to the ear cup 314. The movement of a triggering device activates a sensor device powering on the electronic headphones 100.

To automatically deactivate/power-off electronic circuitry in the electronic headphones 100, a wearer moves the electronic headphones 302 to a non-operational position. In one example, the wearer grasps the ear cups 314 and separates the ear cups 314 from their ears by swinging and/or rotating the ear cups 314/swing arms 310 away from their ears. The separated position may be a non-operational position. Ear cups 314 may be rotated forward towards the front of the hard hat 300 or backward towards the back of hard hat 300 for storage in a non-operational position. Tabs on the accessory connector 306 on the electronic headphones 302 may pressed to release the accessory connector 306 from the accessory mounts 304 on the hard hat 300. The new position, orientation, and/or movement of the ear cups 314, accessory connector 306, the swivel assembly 308, or the swing arm 310 deactivates a sensor device powering off the electronic headphones 302.

Figure 4:
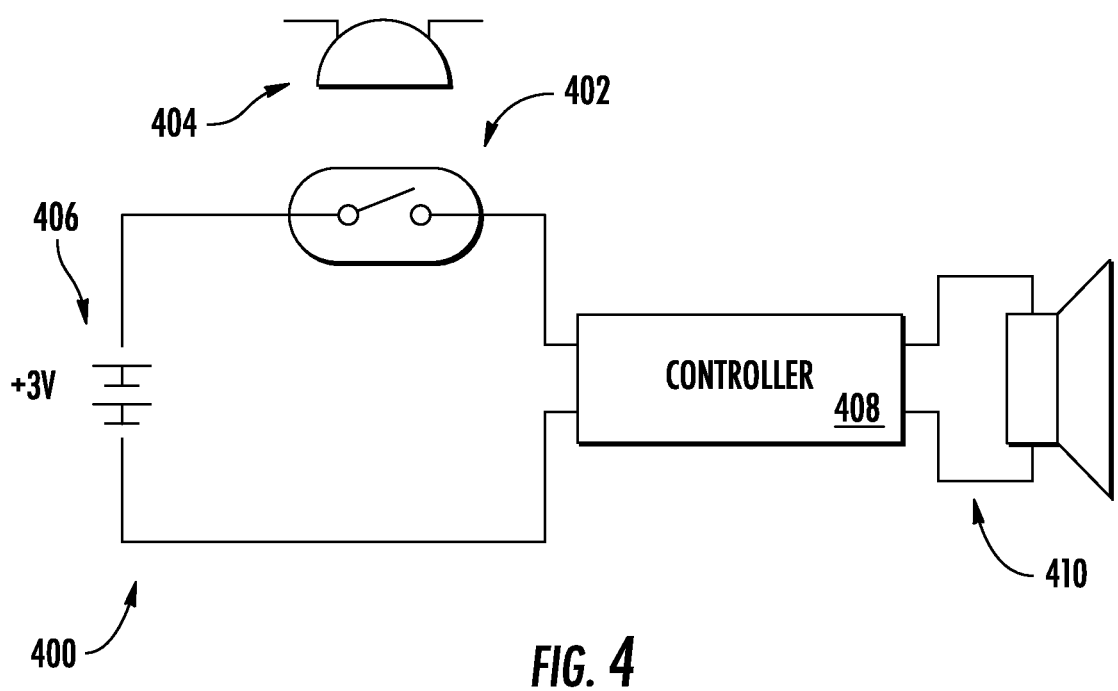
FIG. 4 is a circuit diagram with a reed switch according to aspects of the present disclosure.

FIG. 4 is a circuit diagram 400 with a reed switch 402. Circuit diagram 400 includes a reed switch 402 that may be activated by a magnet 404. The reed switch 402 may be electrically coupled to a power source 406, and a controller 408 configured to control electronic circuitry 410 on electronic headphones. Electronic circuitry 410 may include audio transducer/speaker equipment, noise reduction or cancelling microphones, networking interfaces, user interface circuitry (including, e.g., LEDs).

The reed switch 402 is one exemplary sensor mechanism for automatically powering on and off electronic headphones; such as the electronic headphones 100 illustrated in FIGS. 1 and 2 and the electronic headphones 302 illustrated in FIG. 3. The reed switch 402 includes contacts that are open in a resting state/when not in the presence of a magnetic triggering device and closed when a magnet/magnetic field is present. In an alternative example, the contacts of the reed switch 402 may be normally closed (and open when a magnetic field is applied).

The mechanical motion of the reeds/contacts may be selected to be below the fatigue limit of the materials, so the reeds/contacts may not break due to fatigue. Wear and life of the reeds/contacts of the reed switch 402 may depend on the electrical load's effect on the contacts along with the properties of the reed switch 402 used. In general, higher voltages and higher currents cause faster wear and shorter life. Contact surface wear occurs when the switch contacts open or close. Because of this, manufacturers rate the life of the reed switch 402 in number of operations (e.g., thousands, hundreds of thousands, millions, or billions of operations) and the reed switch 402 may be selected to exceed the expected life of the electronic headphones. Depending on the expected use and life of the electronic headphones, a proper reed switch 402 may be selected to meet these requirements.

In some exemplary embodiments, the reed switch 402 contains a pair of magnetizable, flexible, metal reeds whose end portions are separated by a small gap when the switch is open. The reeds within the reed switch 402 are hermetically sealed within a tubular glass envelope, however, other suitable protective covers may be used to seal the reed switch 402 such as glass ceramics, plastics, or non-ferrous metals. The sealed envelope of the reed switch 402 may be filled with a dry inert-gas protecting contacts of the reed switch 402 from contamination. In another exemplary embodiment, the reed switch 402 contains one flexible reed that moves between a fixed normally-open contact and a fixed normally-closed contact. The normally-closed contact is non-ferromagnetic and is closed by the flexible reed's spring force. In a further exemplary embodiment, the reed switch 402 has multiple poles.

A magnetic field from a permanent magnet or an electromagnet cause the reeds within the reed switch 402 to attract each other, thus completing an electrical circuit. The spring force of the reeds causes them to separate, and open the circuit, when the magnetic field ceases. Another embodiment includes a non-ferromagnetic normally-closed contact that opens when the ferromagnetic normally-open contact closes. A thin layer of non-ferromagnetic material may be applied to the contact area of the reed switch 402 to serve as an electrical contact switching (wear) surface and, for normally-open contacts, as a magnetic spacer whose thickness controls the magnetic field level at which the contact opens (called the "drop-out"). Contacts of the reed switch 402 may include rhodium, ruthenium, iridium, tungsten, mercury, or any other suitable non-magnetic material.

As a brief aside, the amount of magnetic field necessary to actuate the reed switch 402 as well as the sensitivity is measured in units of ampere-turns (AT) and corresponds to the current in a coil multiplied by the number of turns. Typical pull-in (operating) sensitivities range from 8 to 40 AT. One benefit of the reed switch 402 over other types of magnetic sensors is the precise range of sensitivity that may be selected. For example, the reed switch 402 may be specified for a sensitivity from 18 to 22 AT. This has a relative sensitivity range of (22–18)/20=20% or ±10%. In comparison, a micro-power Hall effect sensor may have a sensitivity range of 25 to 55 Gauss (2.5 to 5.5 mT), with a resultant relative sensitivity range of 75% or ±37%. A nano-power MR sensor may have a sensitivity range of 6 to 20 Gauss (0.6 to 2.0 mT), with a resultant relative sensitivity range of 108% or ±54%. The activation magnetic field of a selected reed switch may be based on one or more of: the type and strength of the magnet 404, the distance between the magnet 404 and the reed switch 402 when in an operational position, and the variability of the operational position based on different wearers and usage conditions. In one example, the reed switch 402 may include a STANDEX ELECTRONICS MK16 series reed sensor or any other suitable reed sensor that will sense the position of the magnet 404 when the electronic headphones are placed in an operational position.

The magnet 404 may be a triggering device that can activate the reed switch 402. The magnet 404 may be made of iron, steel, nickel, cobalt, rare-earth elements/metals, or any suitable metal (or alloy) that produces a force that pulls on other ferromagnetic materials and attracts or repels other magnets that can activate (or disable) the reed switch 402. In typical applications, the magnet 404 is a permanent magnet that creates a persistent magnetic field. In other applications, magnet 404 is an electromagnet that creates a magnetic field when in the presence of an electric current.

As the reed switch 402 may provide a simple "on" and "off" mechanism, the functioning of or inputs to the reed switch 402 does not need to be managed by the controller 408. In various examples, the controller 408 does not need any specialized circuitry to work with the reed switch 402, e.g., an off-the-shelf/commodity controller. In other exemplary embodiments, the reed switch 402 is coupled to or built as part of the controller 408. For example, an off-the-shelf reed switch may be installed on a printed circuit board (PCB) with the controller 408. In such embodiments, the reed switch 402 may be used to control/power certain components of the electronic circuitry 410 on electronic headphones but not control/power other components of the electronic circuitry 410. Those other components may have constant access to power, or a subset of the power, provided by the power source 406 and bypass the reed switch 402.

The controller 408 may include circuitry/components to control the operation of the electronic circuitry 410 on electronic headphones. The electronic circuitry may include speakers, noise mitigation circuitry, charging circuitry to charge the power source 406, microphones, networking components, etc.

The power source 406 may include a battery. The battery may include one or more disposable and/or and rechargeable batteries. Disposable batteries (single use) may include alkaline batteries, zinc-chloride batteries, zinc-carbon batteries, or any other suitable battery that can provide power to the controller 408 and electronic circuitry of the electronic headphones. Rechargeable batteries may be recharged for multiple uses and may include Ni-MH, NiCd, lithium-ion, or any other battery chemistry. A suitable rechargeable battery may provide power to the controller 408 and electronic circuitry of the electronic headphones for a suitable period of time on a single charge in a compact form factor to fit within the electronic headphones. Rechargeable batteries do not have to be replaced after discharge and the form factor/size may be customized to fit into the form factor of the electronic headphones. Rechargeable batteries, however, may self-discharge more quickly than disposable batteries, i.e., slowly discharge even during non-use. Disposable batteries typically have a longer shelf life during non-use as they do not self-discharge to the same degree as rechargeable batteries.

As the reed switch 402 does not use battery power to activate (or deactivate), the electronic headphones may be left in a non-operational state and available for use after extended periods of non-use. Electronic circuitry 410 and the controller 408 electrically coupled to the reed switch 402 may not use "vampire draw" from the power source 406 as the circuit connecting electronic circuitry 410 and the controller 408 is not closed. In emergency situations, therefore, it may be useful to have the electronic headphones loaded with a disposable battery power source 406 when coupled to the reed switch 402.

Figure 5:
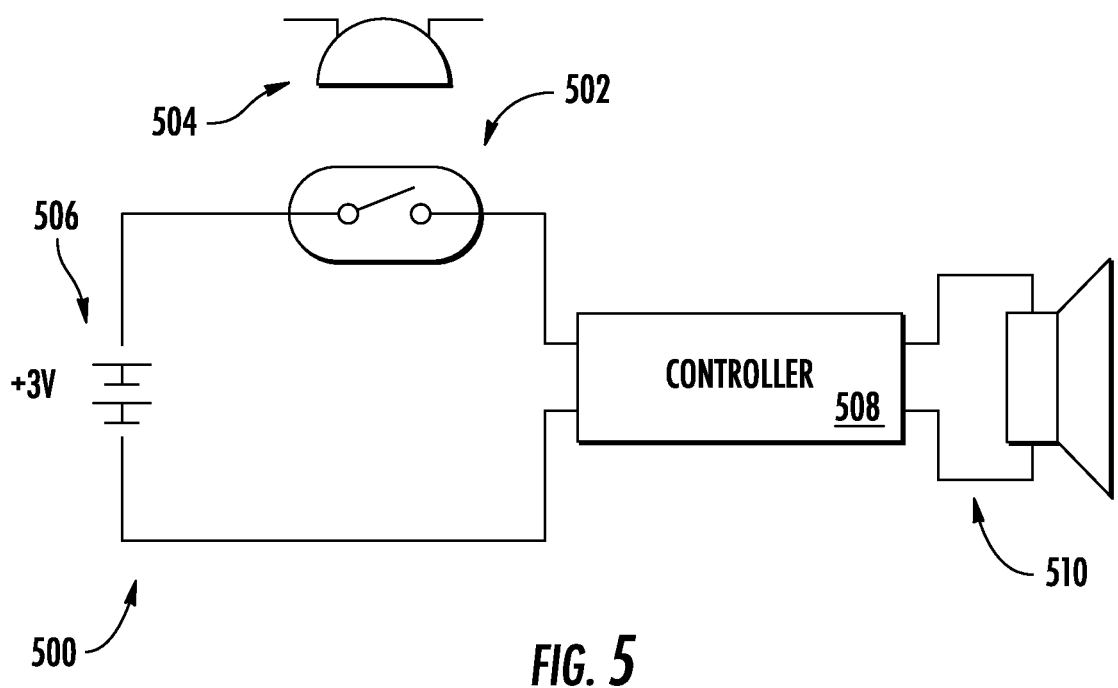
FIG. 5 is a circuit diagram with a Hall effect sensor according to aspects of the present disclosure.

FIG. 5 is a circuit diagram 500 with a Hall effect sensor 502. Circuit diagram 500 includes a Hall effect sensor 502 that may be activated by a magnet 504. The Hall effect sensor 502 may be electrically coupled to a power source 506, and a controller 508 configured to control electronic circuitry 510 on electronic headphones. Electronic circuitry 510 may include audio transducer/speaker equipment, noise reduction or cancelling microphones, networking interfaces, user interface circuitry (including, e.g., LEDs).

The Hall effect sensor 502 is one exemplary sensor mechanism for automatically powering on and off electronic headphones, such as the electronic headphones 100 illustrated in FIGS. 1 and 2 and the electronic headphones 302 illustrated in FIG. 3. is a type of sensor which detects the presence and magnitude of a magnetic field using the Hall effect. The Hall effect is the production of a voltage difference across an electrical conductor that is transverse to an electric current in the conductor and to an applied magnetic field perpendicular to the current. The output voltage of a Hall sensor is based on the strength of the field.

The Hall effect sensor 502 may include a digital output Hall effect sensor or an analog/linear output Hall effect sensor. A digital output Hall effect sensor provides an "on" or "off" switch based on the amount of magnetic flux exceeding a pre-set threshold sensed by the Hall effect sensor 502. This threshold may be set/selected based on the strength and proximity of the magnet 504. In some examples, this threshold may be controlled by a Schmitt-trigger or another switch with similar functionality with built in hysteresis connected to an amplifier on the Hall effect sensor 502. When the magnetic flux exceeds the threshold, the output from the Hall effect sensor 502 switches between the "off" state to an "on" state without any type of physical contact bounce.

An analog/linear output Hall effect sensor may output voltage directly proportional to the intensity of the magnetic flux passing through the Hall effect sensor 502. Specifically, the Hall voltage may be calculated as:

$$V_H = R_H \left( \frac{I}{t} \times B \right) \qquad \text{EQN 1:}$$

where $V_H$ is the Hall voltage (in volts), RH is the Hall effect co-efficient, I is the current flow through the Hall effect sensor 502 (in amperes), t is the thickness of the sensor (in mm), and B is the magnetic flux density (in Teslas). In some examples, the Hall effect sensor 502 has a maximum Hall voltage ($V_H$) when a particular magnetic flux density (B) meets or exceeds a particular predefined threshold. The value of $V_H$ is therefore capped based on this threshold and an increase in magnetic flux will not have an additional effect on the Hall voltage.

Further, the Hall effect sensor 502 may include unipolar sensor that is triggered by only one pole (either the south or north) of magnet 504. Alternatively, the Hall effect sensor 502 may include a bipolar sensor which operate using either positive or negative magnetic fields. Such bipolar functionality is similar to the operation of a reed switch (without the need for mechanical contacts).

Unlike a reed switch (such as the reed switch 402 discussed with reference to FIG. 4), the Hall effect sensor 502 uses a constant flow of electrons to generate the output voltage. Thus, there will be a continuous drain on the power source 506 to power the Hall effect sensor 502 and/or the controller 508. Unlike a reed switch which may only have two states ("on" and "off"), the Hall effect sensor 502 may be able to detect small differences in magnetic field strength and provide a varied output voltage according to the magnetic field strength. In some applications, an amplifier circuit on the Hall effect sensor 502 or the controller 508 may be used to make the differences in output voltage large enough to be detected or usable by the controller 508.

The controller 508 may be configured to respond to the different output voltages supplied by the Hall effect sensor 502. For example, small changes in the relative position of the Hall effect sensor 502 and the magnet 504 may be detected by the controller 508. Thus, small positional or angular differences between components, e.g., ear cups 104 and pivot arms 106 of electronic headphones 100 of FIG. 1, may be detected for fine-tuned detection of whether the electronic headphones are in an operational or non-operational configuration and power "on" or "off" the electronic headphones accordingly. In some examples, the different output voltages may refer to different levels of proximity between the magnet 504 and the Hall effect sensor 502. The controller 508 may be tuned to activate electronic circuitry 510 at particular output voltages and deactivate electronic circuitry at other output voltages. Such tuning of the automatic power on/off can occur during design/production/product testing (through code in the controller 508), production/testing, or by a wearer (though sensor calibration when the electronic headphones are on the head of the wearer).

While the example circuitry of circuit diagram 400 of FIG. 4 and the circuit diagram 500 of FIG. 5 illustrate components in series; it will be appreciated by those of ordinary skill that other configurations may be used. For example, multiple sensors, and multiple types of sensors/switches, may be setup in parallel and provide power if any of the sensors are activated. Multiple sensors, and multiples types of sensors/switches, may also be setup in series and require both/all to be activated to provide power to the (other) electronic components of the electronic headphones. For some sensor types, a separate or specialized microcontroller may be used to interpret/amplify/use the output from the sensor. Other types of sensors/switches are self-contained and do not require a separate or specialized microcontroller.

Practitioners of ordinary skill, given the contents of the present disclosure, will appreciate that a variety of sensor types may be used in place of (or in conjunction with the reed switch (illustrated in FIG. 4) or Hall effect sensor (illustrated in FIG. 5). For example, the sensor device may also include a magnetoresistive (MR) sensor. An MR sensor detects changes in the electrical resistance of an MR element when a magnetic field is applied across the element (also known as a magnetoresistive effect). Specifically, the resistance increases when the current is in the same direction as the magnetic force and decreases when the current is at a 900 angle to the magnetic force. An MR sensor detects the angle of a parallel magnetic field. Typically, MR sensors have a larger detectable area than a Hall effect sensor. MR sensors may be available in a variety of sensitivities which may allow for fine tuning the design of the electronic headphones without. These sensors may be used without the sensor output requiring interpretation by a microcontroller and instead operated as a stand-alone sensor.

Other types of MR sensors include giant MR (GMR), tunnel MR (TMR), and anisotropic MR (AMR) sensors. GMR is a quantum mechanical magnetoresistance effect observed in multilayers composed of alternating ferromagnetic and non-magnetic conductive layers. TMR is an extension of spin-valve GMR, in which the electrons travel with their spins oriented perpendicularly to the layers across a thin insulating tunnel barrier (replacing the non-ferromagnetic spacer). TMR is an MR effect that occurs in a magnetic tunnel junction (MTJ), which is a component consisting of two ferromagnets separated by a thin insulator. If the insulating layer is thin enough (typically a few nanometers), electrons can tunnel from one ferromagnet into the other. For example, the sensor may include a RED ROCK RR122 TMR sensor or other suitable sensor type that can sense the position of a magnet or other triggering device when the electronic headphones are placed in an operational position.

An AMR sensor uses the fact that resistance is dependent on the angle between the current direction and the magnetization, which can be influenced through an external magnetic field. The resistance is smallest at a 90° angle and highest when the current flows in parallel. For example, when an object with its own magnetic field approaches the AMR sensor, the electrical resistance changes. The AMR sensor detects the angle the external magnetic field (and thus the object) is positioned in relation to the sensor. The magnetization of the field also makes it possible to determine the distance.

Such sensors may allow the controller to precisely detect the configuration of components of the electronic headphones. For example, the controller may determine whether the electronic headphones are being safely worn by the wearer and can alert the user or not turn on the device until the headphones are in safe configuration. Additionally, the controller may determine which components within the electronic headphones to power based on the detected configuration.

Figure 6:
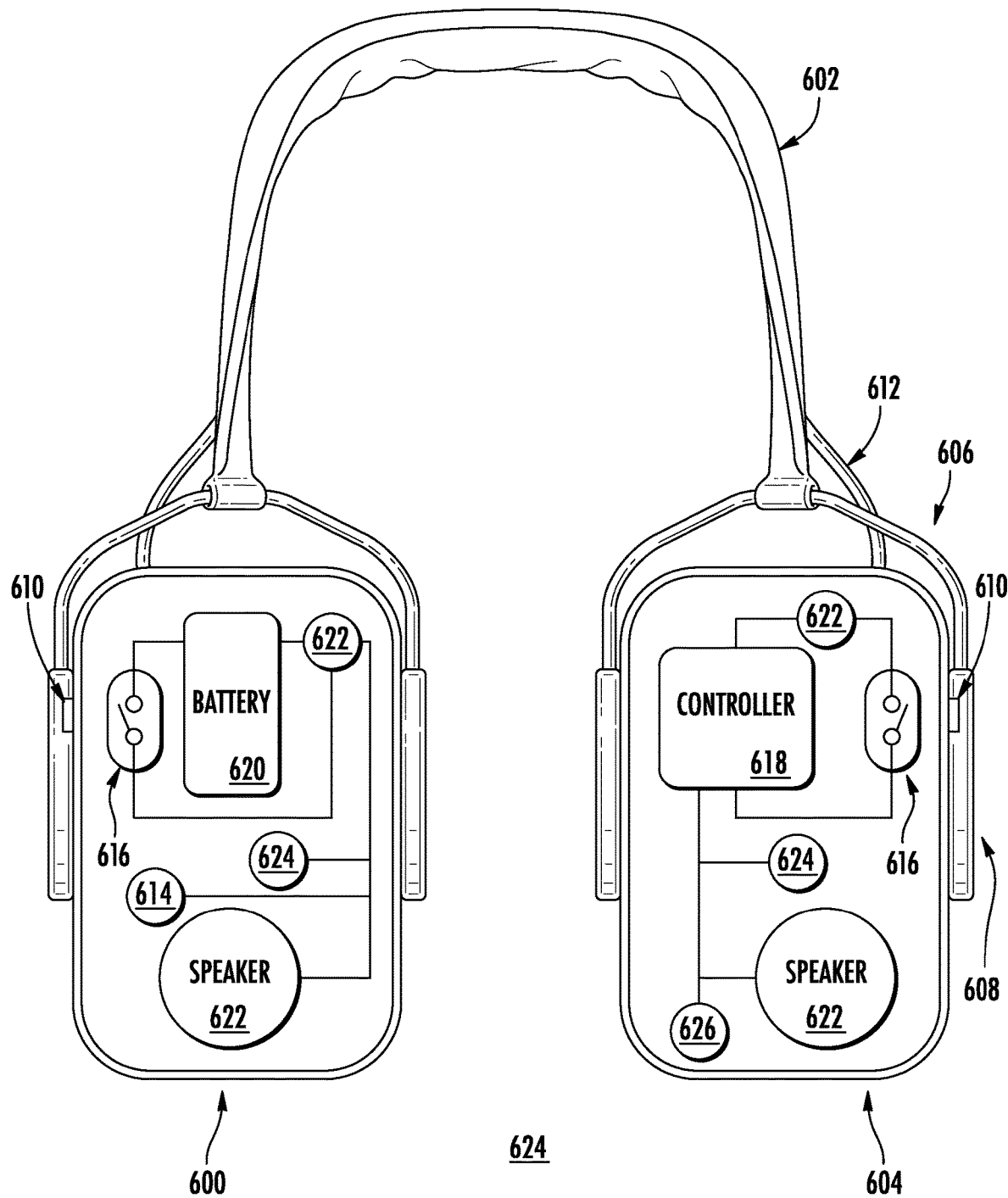
FIG. 6 depicts a cutaway view of electronic headphones showing a block diagram of internal circuitry according to aspects of the present disclosure.

FIG. 6 depicts a cutaway view of electronic headphones 600 showing a block diagram of internal components. The electronic headphones 600 may include headband 602 which connects ear cups 604 via pivot arms 606 at rotary hinge 608. Pivot arms 606 may include one or more triggering device 610. The triggering device 610 is configured to trigger one or more sensor device 616 in one or more ear cup 604 to turn the electronic headphones 600 "on" when the electronic headphones 600 are in an operational position and "off" when in a non-operational position. Each ear cup 604 is configured to fit on or over the ears of a wearer. Circuitry in each ear cup 604 may be connected via cable 612 that runs along the headband 602. Cable 612 may allow for the transfer of power (from e.g., the power source 620) and data (from various inputs and controller 618) to the various electronic components in electronic headphones 600. One ear cup 604 includes an audio-in port 614 for accepting auxiliary audio input from an audio source.

The power source 620 may include any suitable power source including one or more batteries or a battery holder/mount that may accept one or more batteries to provide power to electronic components on the electronic headphones 600. The battery holder/mount may include a door with a cutout in one or more of the ear cups 604. As discussed above, the batteries may be disposable or rechargeable. In some examples, the power source 620 may be recharged via a direct current (DC) connectable charger within the electronic headphones. In other examples, individual rechargeable batteries may be removed from a battery holder in the electronic headphones and charged separate from the electronic headphones 600.

The triggering device 61o on the pivot arm 606 of the electronic headphones is configured to trigger the sensor device 616 when the electronic headphones are in an operational position (or, alternatively a non-operational position). The triggering device 61o may include a magnet or any other device that may trigger the sensor device 616 as described in further detail above.

The sensor device 616 in the ear cup 604 is electrically coupled to and acts as a switch to control power to one or more of the electronic components of the electronic headphones 600 (including the controller 618, the speaker 622, the microphone 624, the LED 626) from the power source 620. When the electronic headphones are in an operational position, the triggering device may activate the sensor device 616 switching on or increasing power to some or all of the electronic components of the electronic headphones 600. The sensor device 616 any suitable switch or sensor that can be triggered by a triggering device when electronic headphones 600 are in an operational position (or, alternatively a non-operational position).

The microphones 624 may include a transducer to convert air pressure variations of a sound wave to an electrical signal. The microphones 624 may be used to capture ambient sound as part of noise cancelling/sound attenuating or for sound amplification. Wanted sounds, such as those of the wearer during a phone call or someone instructing the wearer, may be captured by the microphone for transmission or amplification by the controller 618. In some examples, the microphones 624 are built into the ear cup 604. In other examples, the microphone 624 includes an external microphone coupled to the electronic headphones 600 via a microphone arm.

The speakers 622 include a transducer to convert electrical signals (from, e.g., the controller 618) to sound. A speaker driver in the speakers 622 includes a motor attached to a diaphragm or speaker cone to produce the sound. In some examples, speakers 622 includes a moving coil "dynamic" driver, am electrostatic driver, an electret driver, a planar magnetic driver, a balanced armature driver, magnetorestriction, or any other transducer technology capable of converting an electrical audio signal to sound.

The controller 618 of the electronic headphones 600 is operational, configured, and/or adapted to operate the electronic headphones 600 including the features, functionality, characteristics and/or the like as described herein. To this end, the controller 618 is operably connected to all of the electronic components of the electronic headphones 600. Controller 618 may include a printed circuit board assembly with various modules. While illustrated as a single controller 618, the described functionality may be performed by a plurality of controllers/circuit boards that may or may not be in data communication.

Controller 618 may allow for communication with various devices using various means. In one particular embodiment, the controller 618 includes a network interface and antenna that is configured to communicate with other devices. The network interface may communicate via personal area networks (e.g., Bluetooth), local area networks (e.g., Wi-Fi), and/or wide area networks (e.g., cellular networks). For example, a network interface may connect to another electronic headphone device (e.g., in a hard hat implementation as such as illustrated in FIG. 3) and/or a source of audio such as a wearer's smartphone/smart watch, radio, or other device.

It will be appreciated that the various ones of the foregoing aspects of the present disclosure, or any parts or functions thereof, may be implemented using hardware, software, firmware, tangible, and non-transitory computer-readable or computer usable storage media having instructions stored thereon, or a combination thereof, and may be implemented in one or more controllers/systems.

The controller 618 may be controlled by the program instructions contained within a memory. The memory may be on-board the controller 618 or may be in a separate device. The program instructions may be configured to process inputs from various microphones to perform active noise cancellation/sound attenuation. For example, the controller 618 may produce and send output signals to the speakers 622 to generate out of phase sound waves to attenuate or cancel unwanted or ambient noise to reduce harmful noise or provide sound isolation for the wearer. The program instructions may be further configured to output/amplify audio through the speakers 622 from various inputs (e.g., the microphones 624, the audio-in port 614, network connections, a volume control dial, etc.) to make desired sounds (e.g., commands) easier to hear/understand over ambient noise. Furthermore, the program instructions may be configured to output status information via one or more light emitting diode (LED) 626. For example, the LED 626 may be turned on when the controller 618 is powered on, may blink at various intervals or glow certain colors to communicate status information of a network connection, a noise cancellation or sound amplification status, battery level, etc.

While the foregoing examples are presented in the context of program instructions stored in non-transitory computer-readable memory, that are executed by a controller, other implementations of logic may be substituted with equal success by artisans of ordinary skill given the contents of the present disclosure. Examples of such logic may include e.g., application specific integrated circuits (ASICs) that are fabricated from combinatorial (AND, OR, NOR, NAND, XOR, etc.) and/or sequential logic (flip flops, latches, etc.), programmable logic arrays, and look-up-table implementations of combinatorial/sequential logic (e.g., programmable logic devices (PLDs) and/or field programmable gate arrays (FPGAs)).

Figure 7:
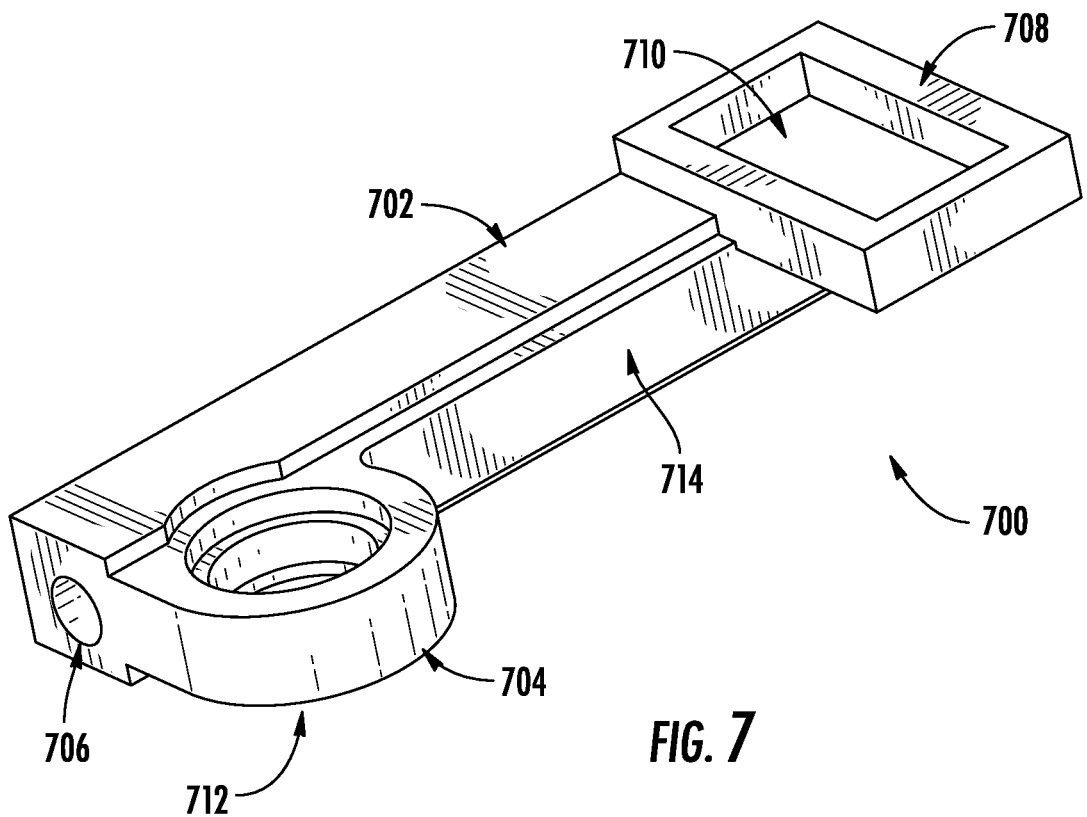
FIG. 7 is a first isometric view of an exemplary pivot arm for use in electronic headphones according to aspects of the present disclosure.
Figure 8:
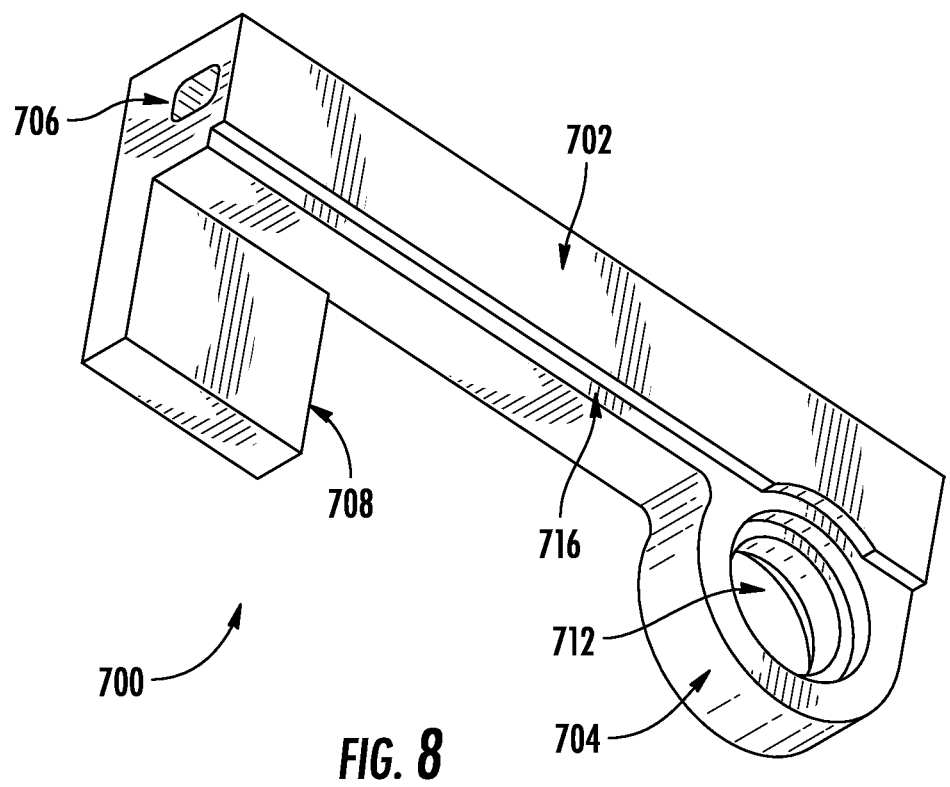
FIG. 8 is a second isometric view of the exemplary pivot arm for use in electronic headphones according to aspects of the present disclosure.

FIG. 7 is a first isometric view of an exemplary pivot arm 700 for use in electronic headphones according to aspects of the present disclosure. FIG. 8 is a second isometric view of the exemplary pivot arm 700. Alone or in pairs, the pivot arm 700 is configured to couple ear cups with a headband or and/or a swing arm of the electronic headphones. The pivot arm 700 may be made of one or a combination of materials including plastic/polymer, metal, etc. using one or more techniques including injection molding, 3D printing, machined, cast, etc. The pivot arm 700 may include a body 702, a hinge point aperture frame 704 that surrounds hinge point aperture 712, a support wire recess 706, a triggering device frame 708 that surrounds a triggering device recess 710.

Extending from the body 702 of the pivot arm 700 is a hinge point aperture frame 704 that surrounds hinge point aperture 712. The hinge point aperture 712 is configured to accept a rotary hinge (e.g., the rotary hinge 108 of FIG. 1) to couple the pivot arm 700 to an ear cup (e.g., the ear cup 104 of FIG. 1) that allows pivot arm to rotate about the hinge point aperture 712/rotary hinge. The hinge point aperture frame 704 may be shaped to accept and allow rotational movement of the rotary hinge. This may include rounding portions of the body 702 of the pivot arm 700 with a (partial) counterbore to accommodate the rotary hinge. A bushing may be inserted between the hinge point aperture frame 704 and the rotary hinge inside the hinge point aperture 712 to provide a bearing surface for the rotary hinge to rotate. While illustrated at one end of the pivot arm 700, in other examples, the hinge point aperture frame 704 sounding the hinge point aperture 712 may be located more centrally along the body 702 of the pivot arm 700.

The body 702 of the pivot arm 700 includes one or more steps 714 and 716. The steps may allow the pivot arm 700, when rotating about the hinge point aperture 712, to clear obstructions such as the rotary hinge or portions of the ear cup of the electronic headphones.

The pivot arm 700 may be coupled to a headband (e.g., the headband 102 of FIG. 1) or and/or a swing arm (e.g., the swing arm 310 of FIG. 3) of the electronic headphones. A support wire may loop around one end of the headband and fit within a support wire recess 706. In the illustrated example, the support wire recess 706 goes straight through the body 702 of the pivot arm 700. In other examples, the support wire recess 706 terminates inside the body 702. The support wire may be coupled to the pivot arm 700 with an adhesive, particularly in applications where the support wire terminates inside the body 702 of the pivot arm 700. Where the support wire is threaded through the entire length of the support wire recess 706, the end of the support wire may be capped to stop the pivot arm 700 from sliding off the support wire.

The triggering device frame 708 extends from the body 702. The triggering device frame surrounds a triggering device recess 710 that is configured to hold a triggering device. While illustrated as a rectangular recess, the triggering device recess 710 may be any shape to accommodate the triggering device. The triggering device may be installed within the triggering device recess 710 with an adhesive. In some embodiments, a cover or door encloses the triggering device recess 710 to encapsulate the triggering device. As the pivot arm 700 rotates, the triggering device may come in proximity with a sensing device on, e.g., an ear cup of the electronic headphones. As illustrated the triggering device frame is at one end of the body 702. Other positions for the triggering device frame 708 may be selected based on the desired positioning of a triggering device, so the triggering device may be in proximity with the sensing device when the electronic headphones are worn.

It will be apparent to those skilled in the art that various modifications and variations can be made in the disclosed embodiments of the disclosed device and associated methods without departing from the spirit or scope of the disclosure. Thus, it is intended that the present disclosure covers the modifications and variations of the embodiments disclosed above provided that the modifications and variations come within the scope of any claims and their equivalents.

What is claimed is:

1. An electronic headphone set comprising:
a pair of ear cups, at least one ear cup of the pair of ear cups movable between a usable position and an unusable position;
a headband interconnecting the pair of ear cups;
electronic circuitry operably connected to the pair of ear cups;
a switch operably interconnecting the at least one ear cup to the headband and operable to enable the electronic circuitry when in the usable position and to disable the electronic circuitry when in the unusable position;
a pivot arm comprising a triggering device configured to trigger the switch; and
a rotary hinge, where the rotary hinge couples the pivot arm to the at least one ear cup and enabling the at least one ear cup to rotate.

2. The electronic headphone set of claim 1, where:
the triggering device comprises a magnet, and
enabling the electronic circuitry comprises activating a reed switch or a Hall effect sensor electrically coupled to the electronic circuitry.

3. The electronic headphone set of claim 1, where the switch is configured to activate a sensor in the at least one ear cup, the sensor configured to enable the electronic circuitry when in the usable position and to disable the electronic circuitry when in the unusable position.

4. The electronic headphone set of claim 1, where:
the usable position comprises a first position of the at least one ear cup capable of being worn by a wearer, and
the unusable position comprises a second position of the at least one ear cup not capable of being worn by the wearer.

5. The electronic headphone set of claim 1, where the switch comprises at least one of: a magnet, a physical-mechanical interface, a motion sensor.

6. The electronic headphone set of claim 1, where the electronic circuitry comprises at least one of a controller and an audio transducer.

7. An electronic headphone comprising:
a pivot arm comprising a triggering device;
an ear cup movable between an operational configuration and a non-operational configuration, the ear cup comprising electronic circuitry and a sensor device configured to enable the electronic circuitry when in proximity with the triggering device, where the triggering device is configured to trigger the sensor device; and a rotary hinge coupling the pivot arm to the ear cup and enabling the ear cup to rotate.

8. The electronic headphone of claim 7, where the pivot arm is rotatably coupled to the ear cup.

9. The electronic headphone of claim 7, further comprising a power source, where:
the triggering device comprises a magnet,
the sensor device comprises a reed switch, and
enabling the electronic circuitry comprises closing a circuit between the power source and the electronic circuitry.

10. The electronic headphone of claim 7, where:
the triggering device comprises a magnet,
the sensor device comprises a Hall effect sensor or a magnetoresistive (MR) sensor characterized by an output voltage, and
the electronic headphone further comprises a switch configured to enable the electronic circuitry when the output voltage exceeds an output voltage threshold.

11. The electronic headphone of claim 7, where:
the operational configuration comprises a first configuration of the electronic headphone capable of being worn by a wearer, and
the non-operational configuration comprises a second configuration of the electronic headphone not capable of being worn by the wearer.

12. The electronic headphone of claim 7, further comprising:
an accessory mount couplable to a hard hat;
a swivel mechanism coupled to the accessory mount; and
a swing arm coupled to the swivel mechanism.

13. An electronic headphone set comprising:
a headband having a first end and a second end;
a first pivot arm coupled to the first end of the headband, the first pivot arm comprising a triggering device;
a second pivot arm coupled to the second end of the headband;
a first ear cup coupled to the first pivot arm by a first rotary hinge, the first ear cup comprising electronic circuitry and a switch, the switch configured to enable and disable the electronic circuitry based on a relative position of the first ear cup and the triggering device in the first pivot arm; and
a second ear cup coupled to the second pivot arm by a second rotary hinge.

14. The electronic headphone set of claim 13, where the first pivot arm is configured to rotate around the first ear cup about the first rotary hinge when the electronic headphone set moves from a non-operational position to an operational position.

15. The electronic headphone set of claim 13, where the triggering device is configured to interact with the switch in the first ear cup.

* * * * *